US012575234B2

(12) United States Patent
Xie et al.

(10) Patent No.: US 12,575,234 B2
(45) Date of Patent: Mar. 10, 2026

(54) LIGHT-EMITTING SUBSTRATE AND MANUFACTURING METHOD THEREOF, AND DISPLAY DEVICE

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Xiaodong Xie, Beijing (CN); Min He, Beijing (CN); Jing Wang, Beijing (CN); Tianyu Zhang, Beijing (CN); Xue Zhao, Beijing (CN); Tengfei Zhong, Beijing (CN)

(73) Assignees: HEFEI XINSHENGN OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 749 days.

(21) Appl. No.: 17/793,975

(22) PCT Filed: May 17, 2021

(86) PCT No.: PCT/CN2021/094144
§ 371 (c)(1),
(2) Date: Jul. 20, 2022

(87) PCT Pub. No.: WO2022/001425
PCT Pub. Date: Jan. 6, 2022

(65) Prior Publication Data
US 2023/0061318 A1      Mar. 2, 2023

(30) Foreign Application Priority Data

Jun. 30, 2020    (CN) .......................... 202010621948.4

(51) Int. Cl.
| | |
|---|---|
| *H10H 20/857* | (2025.01) |
| *H01L 25/075* | (2006.01) |
| *H10H 20/01* | (2025.01) |

(52) U.S. Cl.
CPC ....... *H10H 20/857* (2025.01); *H01L 25/0753* (2013.01); *H10H 20/01* (2025.01); *H10H 20/0364* (2025.01)

(58) Field of Classification Search
CPC ... H10H 20/857; H10H 20/01; H01L 25/0753
See application file for complete search history.

(56) References Cited

U.S. PATENT DOCUMENTS

| | | | |
|---|---|---|---|
| 8,723,325 B2 | 5/2014 | Chen et al. | |
| 9,685,416 B2 | 6/2017 | Yoshizawa et al. | |
| | (Continued) | | |

FOREIGN PATENT DOCUMENTS

| | | |
|---|---|---|
| CN | 1731262 A | 2/2006 |
| CN | 1953228 A | 4/2007 |
| | (Continued) | |

OTHER PUBLICATIONS

First Office Action of the corresponding Chinese Application No. 202010621948.4 with search report, listing 35 ref.

*Primary Examiner* — Nathan W Ha
(74) *Attorney, Agent, or Firm* — Chiwin Law LLC

(57) ABSTRACT

A light-emitting substrate and a manufacturing method thereof, and a display device are provided. The manufacturing method includes: providing a base substrate; forming a first conductive pattern on the base substrate using a first mask; forming a first insulating layer on the first conductive pattern using a second mask, to form a first via hole and a second via hole; forming a second conductive pattern on the first insulating layer using the first mask, the second conductive pattern being electrically connected to the first conductive pattern through the first via hole and the second (Continued)

via hole; forming a second insulating layer on the second conductive pattern using the second mask, to form a third via hole; and forming a third conductive pattern on the second insulating layer using a third mask, the third conductive pattern being electrically connected to the second conductive pattern through the third via hole.

19 Claims, 6 Drawing Sheets

(56) References Cited

U.S. PATENT DOCUMENTS

| | | | |
|---|---|---|---|
| 9,703,191 | B2 | 7/2017 | Park et al. |
| 10,254,876 | B2 | 4/2019 | Lu et al. |
| 10,418,437 | B1 | 9/2019 | Leng et al. |
| 10,483,296 | B2 | 11/2019 | Yang et al. |
| 10,600,636 | B2 | 3/2020 | He et al. |
| 10,854,699 | B2 | 12/2020 | Lee et al. |
| 10,862,006 | B2 | 12/2020 | Jang et al. |
| 10,916,703 | B2 | 2/2021 | Lee et al. |
| 10,950,636 | B2 | 3/2021 | Huang et al. |
| 11,171,082 | B2 | 11/2021 | Kim et al. |
| 11,329,004 | B2 | 5/2022 | Park |
| 11,353,987 | B2 | 6/2022 | Liu et al. |
| 2010/0237465 | A1 | 9/2010 | Stribley et al. |
| 2015/0316802 | A1 | 11/2015 | Takanishi et al. |
| 2020/0091393 | A1 | 3/2020 | Bae et al. |
| 2020/0155570 | A1 | 5/2020 | Patel et al. |
| 2022/0005989 | A1 | 1/2022 | Ban et al. |

FOREIGN PATENT DOCUMENTS

| | | | |
|---|---|---|---|
| CN | 101118356 | A | 2/2008 |
| CN | 101303935 | A | 11/2008 |
| CN | 101882589 | A | 11/2010 |
| CN | 101995981 | A | 3/2011 |
| CN | 201886234 | A | 6/2011 |
| CN | 102134697 | A | 7/2011 |
| CN | 102201394 | A | 9/2011 |
| CN | 102468306 | A | 5/2012 |
| CN | 102650819 | A | 8/2012 |
| CN | 102866816 | A | 1/2013 |
| CN | 102981676 | A | 3/2013 |
| CN | 103616978 | A | 3/2014 |
| CN | 104716144 | A | 6/2015 |
| CN | 104851789 | A | 8/2015 |
| CN | 105807553 | A | 7/2016 |
| CN | 106169535 | A | 11/2016 |
| CN | 106887439 | A | 6/2017 |
| CN | 106919284 | A | 7/2017 |
| CN | 107706198 | A | 2/2018 |
| CN | 108389869 | A | 8/2018 |
| CN | 209044299 | U | 6/2019 |
| CN | 110047866 | A | 7/2019 |
| CN | 110277072 | A | 9/2019 |
| CN | 110865732 | A | 3/2020 |
| CN | 110972495 | A | 4/2020 |
| CN | 210271564 | U | 4/2020 |
| CN | 111146095 | A | 5/2020 |
| CN | 111326485 | A | 6/2020 |
| CN | 210837796 | U | 6/2020 |
| GB | 9204066 | | 4/1992 |
| JP | 2001174975 | A | 6/2001 |
| JP | 2008283133 | A | 11/2008 |
| KR | 100734663 | B1 | 7/2007 |
| KR | 20110066808 | A | 6/2011 |
| KR | 20170027916 | A | 3/2017 |
| KR | 20170050171 | A | 5/2017 |
| TW | 201417299 | A | 5/2014 |
| WO | 2020036421 | A1 | 2/2020 |

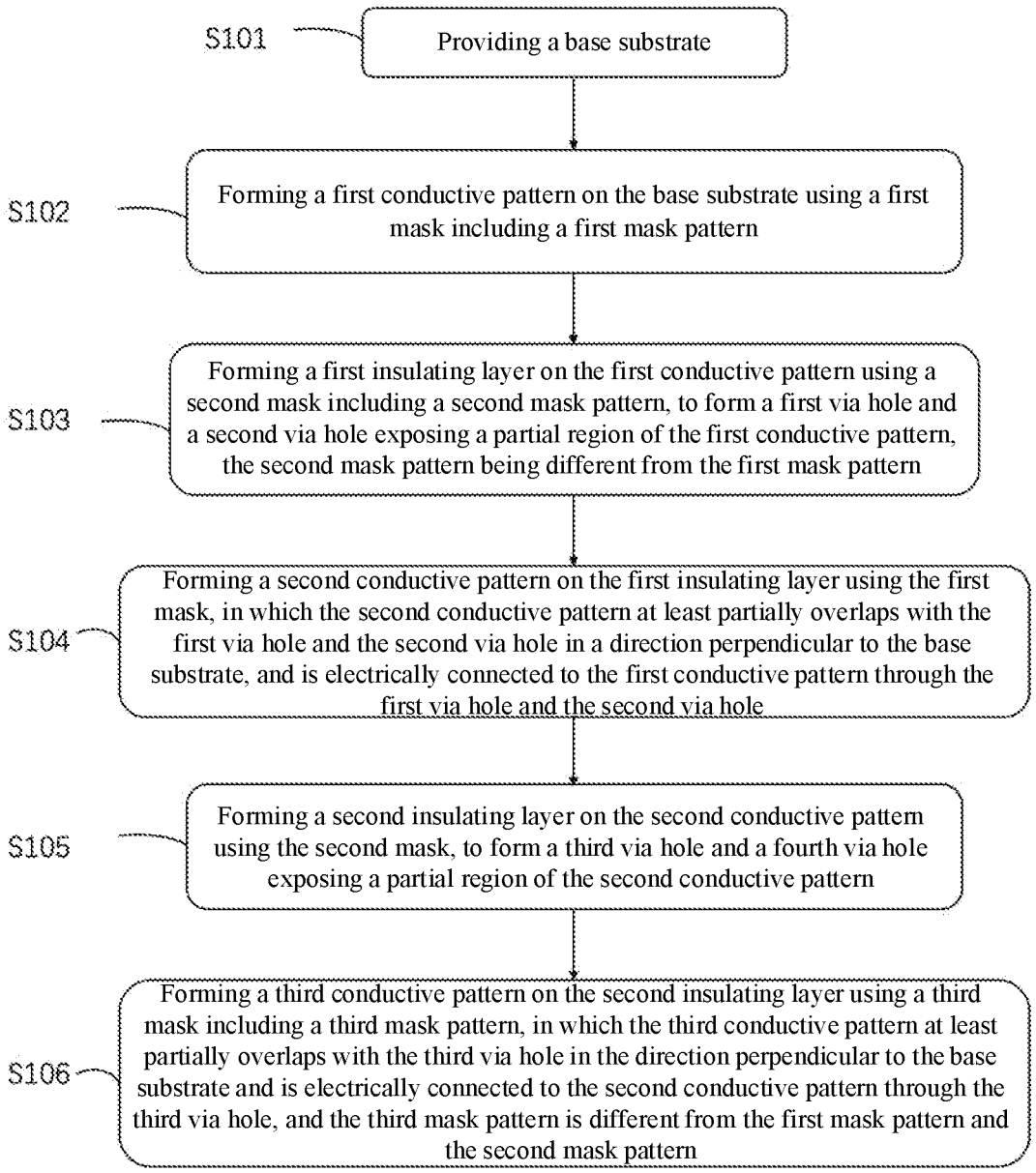

S101 — Providing a base substrate

S102 — Forming a first conductive pattern on the base substrate using a first mask including a first mask pattern S103 — Forming a first insulating layer on the first conductive pattern using a second mask including a second mask pattern, to form a first via hole and a second via hole exposing a partial region of the first conductive pattern, the second mask pattern being different from the first mask pattern S104 — Forming a second conductive pattern on the first insulating layer using the first mask, in which the second conductive pattern at least partially overlaps with the first via hole and the second via hole in a direction perpendicular to the base substrate, and is electrically connected to the first conductive pattern through the first via hole and the second via hole S105 — Forming a second insulating layer on the second conductive pattern using the second mask, to form a third via hole and a fourth via hole exposing a partial region of the second conductive pattern S106 — Forming a third conductive pattern on the second insulating layer using a third mask including a third mask pattern, in which the third conductive pattern at least partially overlaps with the third via hole in the direction perpendicular to the base substrate and is electrically connected to the second conductive pattern through the third via hole, and the third mask pattern is different from the first mask pattern and the second mask pattern

FIG. 1

LIGHT-EMITTING SUBSTRATE AND MANUFACTURING METHOD THEREOF, AND DISPLAY DEVICE

This application is a U.S. National Phase Entry of International Application No. PCT/CN2021/094144, filed on May 17, 2021, designating the United States of America and claiming priority to Chinese Patent Application No. 202010621948.4, filed on Jun. 30, 2020. The present application claims priority to and the benefit of the above-identified applications and the above-identified applications are incorporated by reference herein in their entirety.

TECHNICAL FIELD

Embodiments of the present disclosure relate to a light-emitting substrate and a manufacturing method thereof, and a display device.

BACKGROUND

With the development of light-emitting diode technology, the backlight using the submillimeter or even micron light-emitting diode has been widely used. Thus, not only the image contrast of such as a transmission display product using the backlight can reach the level of the organic light-emitting diode (OLED) display product, but also the product can retain the technical advantages of the liquid crystal display (LCD), so as to improve the display effect of the image and provide users with better visual experience.

SUMMARY

At least an embodiment of the present disclosure provides a manufacturing method of a light-emitting substrate, and the manufacturing method includes: providing a base substrate; forming a first conductive pattern on the base substrate using a first mask comprising a first mask pattern; forming a first insulating layer on the first conductive pattern using a second mask comprising a second mask pattern, to form a first via hole and a second via hole exposing a partial region of the first conductive pattern, the second mask pattern being different from the first mask pattern; forming a second conductive pattern on the first insulating layer using the first mask, the second conductive pattern at least partially overlapping with the first via hole and the second via hole in a direction perpendicular to the base substrate, and being electrically connected to the first conductive pattern through the first via hole and the second via hole; forming a second insulating layer on the second conductive pattern using the second mask, to form a third via hole and a fourth via hole exposing a partial region of the second conductive pattern; and forming a third conductive pattern on the second insulating layer using a third mask comprising a third mask pattern, the third conductive pattern at least partially overlapping with the third via hole in the direction perpendicular to the base substrate and being electrically connected to the second conductive pattern through the third via hole, and the third mask pattern being different from the first mask pattern and the second mask pattern.

For example, in the manufacturing method of the light-emitting substrate provided by at least an embodiment of the present disclosure, an orthographic projection of the first via hole on the base substrate at least partially overlaps with an orthographic projection of the third via hole on the base substrate, and an orthographic projection of the second via hole on the base substrate at least partially overlaps with an orthographic projection of the fourth via hole on the base substrate.

For example, in the manufacturing method of the light-emitting substrate provided by at least an embodiment of the present disclosure, the first mask pattern comprises a first preparation pattern for forming a conductive pattern and a first positioning pattern for positioning, and the second mask pattern comprises a second preparation pattern for forming an insulating pattern and a second positioning pattern for positioning; and the manufacturing method further comprises: forming a first positioning structure using the first positioning pattern of the first mask while forming the first conductive pattern on the base substrate using the first mask; in a process of forming the first insulating layer on the first conductive pattern using the second mask, using the first positioning structure to cooperate with the second positioning pattern of the second mask to position the second mask, and forming a second positioning structure using the second positioning pattern of the second mask while forming the first via hole and the second via hole; in a process of forming the second conductive pattern on the first insulating layer using the first mask, using the second positioning structure to cooperate with the first positioning pattern of the first mask to position the first mask, and forming a third positioning structure using the first positioning pattern of the first mask while forming the second conductive pattern; and in a process of forming the second insulating layer on the second conductive pattern using the second mask, using the third positioning structure to cooperate with the second positioning pattern of the second mask to position the second mask.

For example, in the manufacturing method of the light-emitting substrate provided by at least an embodiment of the present disclosure, the first positioning pattern comprises a first sub-pattern and a second sub-pattern, and the second positioning pattern comprises a third sub-pattern and a fourth sub-pattern; the first sub-pattern of the first positioning pattern is used to form the first positioning structure and the third positioning structure, and the fourth sub-pattern of the second positioning pattern is used to form the second positioning structure; and the second sub-pattern of the first positioning pattern corresponds to the fourth sub-pattern of the second positioning pattern for positioning the first mask, and the third sub-pattern of the second positioning pattern corresponds to the first sub-pattern of the first positioning pattern for positioning the second mask.

For example, in the manufacturing method of the light-emitting substrate provided by at least an embodiment of the present disclosure, forming the first conductive pattern on the base substrate using the first mask comprises: forming the first conductive pattern on the base substrate through the first preparation pattern of the first mask; forming the second conductive pattern on the first insulating layer using the first mask comprises: forming the second conductive pattern on the first insulating layer through the first preparation pattern of the first mask, where the first conductive pattern and the second conductive pattern comprise same conductive pattern portions, and the same conductive pattern portions at least partially overlap in the direction perpendicular to the base substrate.

For example, in the manufacturing method of the light-emitting substrate provided by at least an embodiment of the present disclosure, forming the first insulating layer on the first conductive pattern using the second mask comprises: forming the first insulating layer on the first conductive pattern through the second preparation pattern of the second mask; and forming the second insulating layer on the second conductive pattern using the second mask comprises: forming the second insulating layer on the second conductive pattern through the second preparation pattern of the second mask, the first insulating layer and the second insulating layer comprise same via hole pattern portions, and the same via hole pattern portions at least partially overlap in the direction perpendicular to the base substrate.

For example, the manufacturing method of the light-emitting substrate provided by at least an embodiment of the present disclosure further comprises: forming a fourth conductive pattern on the third conductive pattern using the third mask; and an orthographic projection of the fourth conductive pattern on the base substrate at least partially overlaps with an orthographic projection of the third conductive pattern on the base substrate.

For example, in the manufacturing method of the light-emitting substrate provided by at least an embodiment of the present disclosure, a material of the third conductive pattern comprises a first metal material, a material of the fourth conductive pattern comprises a second metal material, and the first metal material is different from the second metal material.

For example, the manufacturing method of the light-emitting substrate provided by at least an embodiment of the present disclosure further comprises: forming a fifth conductive pattern, different from the third conductive pattern, on the second insulating layer using the third mask while forming the third conductive pattern on the second insulating layer using the third mask; and the fifth conductive pattern is insulated from the first conductive pattern and the second conductive pattern, and a light-emitting element is electrically connected to an output terminal of a driving circuit through the fifth conductive pattern.

For example, the manufacturing method of the light-emitting substrate provided by at least an embodiment of the present disclosure further comprises: forming a third insulating layer, at least partially covering the third conductive pattern and the fifth conductive pattern, on the third conductive pattern and the fifth conductive pattern using a fourth mask; and the third insulating layer comprises a first connection via hole for electrically connecting the fifth conductive pattern to the light-emitting element, and the second insulating layer and/or the third insulating layer comprises a second connection via hole for electrically connecting the light-emitting element to the second conductive pattern.

For example, the manufacturing method of the light-emitting substrate provided by at least an embodiment of the present disclosure further comprises: providing the light-emitting element on the third insulating layer; and the light-emitting element is electrically connected to the fifth conductive pattern through the first connection via hole and is electrically connected to the second conductive pattern through the second connection via hole.

For example, in the manufacturing method of the light-emitting substrate provided by at least an embodiment of the present disclosure, before forming the first conductive pattern on the base substrate using the first mask, the manufacturing method further comprises: forming a buffer layer on the base substrate, wherein the first conductive pattern is formed on the buffer layer.

At least an embodiment of the present disclosure further provides a light-emitting substrate, and the light-emitting substrate includes a base substrate and further includes a first conductive pattern, a first insulating layer, a second conductive pattern, a second insulating layer, and a third conductive pattern which are sequentially arranged on the base substrate in a direction away from the base substrate; the first conductive pattern and the second conductive pattern comprise same conductive pattern portions, and the first insulating layer and the second insulating layer comprise same via hole pattern portions; a via hole pattern of the first insulating layer comprises a first via hole and a second via hole, and the second conductive pattern is electrically connected to the first conductive pattern through the first via hole and the second via hole; a via hole pattern of the second insulating layer comprises a third via hole and a fourth via hole, and the third conductive pattern is electrically connected to the second conductive pattern through the third via hole; and an orthographic projection of the first via hole on the base substrate at least partially overlaps with an orthographic projection of the third via hole on the base substrate, and an orthographic projection of the second via hole on the base substrate at least partially overlaps with an orthographic projection of the fourth via hole on the base substrate.

For example, in the light-emitting substrate provided by at least an embodiment of the present disclosure, the first conductive pattern comprises a plurality of first conductive blocks extending in a first direction, the second conductive pattern comprises a plurality of second conductive blocks extending in the first direction, and the third conductive pattern comprises a plurality of third conductive blocks extending in a second direction different from the first direction; and in a direction perpendicular to the base substrate, at least one of the plurality of second conductive blocks and at least one of the plurality of third conductive blocks at least partially overlap and are electrically connected with each other through the third via hole.

For example, in the light-emitting substrate provided by at least an embodiment of the present disclosure, an orthographic projection of at least one of the plurality of first conductive blocks on the base substrate at least partially overlaps with an orthographic projection of at least one of the plurality of second conductive blocks on the base substrate, and the at least one of the plurality of first conductive blocks is electrically connected to the at least one of the plurality of second conductive blocks through the first via hole and the second via hole.

For example, in the light-emitting substrate provided by at least an embodiment of the present disclosure, the at least one of the plurality of first conductive blocks and the at least one of the plurality of second conductive blocks have same widths in the second direction.

For example, the light-emitting substrate provided by at least an embodiment of the present disclosure further comprises a fifth conductive pattern and a light-emitting element, the fifth conductive pattern is in a same layer as the third conductive pattern, and the light-emitting element is on a side of the third conductive pattern and the fifth conductive pattern away from the base substrate; and the fifth conductive pattern is insulated from the first conductive pattern and the second conductive pattern, the light-emitting element is electrically connected to an output terminal of a driving circuit through the fifth conductive pattern, the fifth conductive pattern comprises at least one fifth conductive block extending in the first direction, a first terminal of the light-emitting element is electrically connected to one fifth conductive block, and a second terminal of the light-emitting element is electrically connected to one second conductive block or another fifth conductive block.

For example, the light-emitting substrate provided by at least an embodiment of the present disclosure further comprises a third insulating layer; and the third insulating layer is between the third conductive pattern and the light-emitting element and between the fifth conductive pattern and the light-emitting element, the third insulating layer comprises a first connection via hole to allow the at least one fifth conductive block to be electrically connected to the first terminal and/or the second terminal of the light-emitting element through the first connection via hole, and the second insulating layer and the third insulating layer comprise a second connection via hole to allow the one second conductive block to be electrically connected to the second terminal of the light-emitting element through the second connection via hole.

At least an embodiment of the present disclosure further provides a display device, and the display device includes the light-emitting substrate according to any one of the embodiments of the present disclosure.

For example, the display device provided by at least an embodiment of the present disclosure further comprises a display panel; and the display panel has a display side and a non-display side opposite to the display side, and the light-emitting substrate is on the non-display side of the display panel to serve as a backlight unit.

BRIEF DESCRIPTION OF THE DRAWINGS

In order to clearly illustrate the technical solutions of the embodiments of the present disclosure, the drawings of the embodiments will be briefly described in the following. It is obvious that the described drawings are only related to some embodiments of the present disclosure and thus are not limitative to the present disclosure.

FIG. 1 is a flowchart of a manufacturing method of a light-emitting substrate provided by some embodiments of the present disclosure;

6

Figure 11:
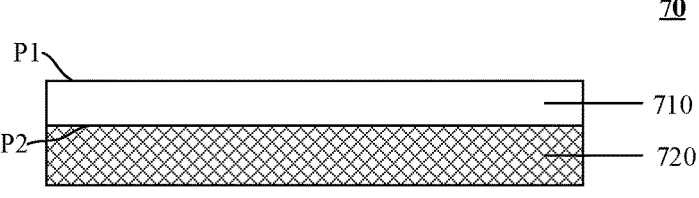

FIG. 11 is a schematic cross-sectional view of a display device provided by some embodiments of the present disclosure.

DETAILED DESCRIPTION

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect," "connected," "coupled," etc., are not intended to define a physical connection or mechanical connection, but may include an electrical connection, directly or indirectly. "On," "under," "right," "left," and the like are only used to indicate relative position relationship, and when the position of the object which is described is changed, the relative position relationship may be changed accordingly.

In the display product using light-emitting diodes, mini light-emitting diodes (Mini LEDs) or micro light-emitting diodes (micro LEDs) have small size and high brightness, and can be widely used in the backlight module of the display device and perform fine adjustment for the backlight, thereby achieving the display of high dynamic range (HDR) images. For example, the typical size (for example, the length) of a micro LED is less than 50 microns, such as 10 microns to 50 microns; and the typical size (for example, the length) of a mini LED ranges from 50 microns to 150 microns, for example, from 80 microns to 120 microns.

In the process of manufacturing the display product using light-emitting diodes, because of the resistance demand of the chip of the light-emitting diode for a metal wiring, the metal wiring pattern used to transmit, for example, a power signal often needs to have a relatively large thickness. For example, during manufacturing process, the film thickness of the metal wiring pattern needs to be greater than 1.8 microns. Therefore, in order to avoid the risk that the metal wiring pattern with large thickness may peel off, the metal wiring pattern usually needs to be divided into multiple film layers for separate preparation.

The inventor(s) found that because multiple film layers of the metal wiring pattern need to be sequentially stacked and contacted with each other, for example, the film pattern located above needs to cover the film pattern located below, the size (such as the line width) of the film pattern located above generally needs to be larger than (wider than) the size of the film pattern located below, so as to ensure the contact effect between adjacent film layers, and at the same time avoid uneven or excessive deposition of the prepared film layer due to the deposition and diffusion of the film material to the edge when preparing the upper film pattern, thereby ensuring the precision and accuracy of the prepared film pattern. However, there are often differences between multiple film patterns of the metal wiring pattern, the above multiple film patterns need to be formed by using different masks to perform the patterning processes respectively, resulting in an increase in the number of masks required in the manufacturing process, which leads to an increase in the manufacturing cost of the product, and also increases the difficulty of product design and processing.

At least one embodiment of the present disclosure provides a manufacturing method of a light-emitting substrate, and the manufacturing method includes: providing a base substrate; forming a first conductive pattern on the base substrate using a first mask including a first mask pattern; forming a first insulating layer on the first conductive pattern using a second mask including a second mask pattern, to form a first via hole and a second via hole exposing a partial region of the first conductive pattern, the second mask pattern being different from the first mask pattern; forming a second conductive pattern on the first insulating layer using the first mask, the second conductive pattern at least partially overlapping with the first via hole and the second via hole in a direction perpendicular to the base substrate and being electrically connected to the first conductive pattern through the first via hole and the second via hole; forming a second insulating layer on the second conductive pattern using the second mask, to form a third via hole and a fourth via hole exposing a partial region of the second conductive pattern; and forming a third conductive pattern on the second insulating layer using a third mask including a third mask pattern, the third conductive pattern at least partially overlapping with the third via hole in the direction perpendicular to the base substrate and being electrically connected to the second conductive pattern through the third via hole, where the third mask pattern is different from the first mask pattern and the second mask pattern.

The manufacturing method of the light-emitting substrate provided by the at least one embodiment of the present disclosure can reduce the number of masks required in the manufacturing process, so as to optimize the manufacturing process of the light-emitting substrate, reduce the manufacturing cost of the light-emitting substrate, reduce the design and processing difficulty of the light-emitting substrate in the manufacturing process, and facilitate mass production and application.

At least one embodiment of the present disclosure further provides a light-emitting substrate and a display device.

In the following, some embodiments of the present disclosure will be described in detail with reference to the accompanying drawings. It should be noted that the same reference numerals in different drawings are used to refer to the same described elements.

FIG. 1 is a flowchart of a manufacturing method of a light-emitting substrate provided by some embodiments of the present disclosure. For example, as illustrated in FIG. 1, the manufacturing method of the light-emitting substrate includes the following steps.

Step S101: providing a base substrate.

Step S102: forming a first conductive pattern on the base substrate using a first mask including a first mask pattern.

Step S103: forming a first insulating layer on the first conductive pattern using a second mask including a second mask pattern, to form a first via hole and a second via hole exposing a partial region of the first conductive pattern, the second mask pattern being different from the first mask pattern.

Step S104: forming a second conductive pattern on the first insulating layer using the first mask, in which the second conductive pattern at least partially overlaps with the first via hole and the second via hole in a direction perpendicular to the base substrate, and is electrically connected to the first conductive pattern through the first via hole and the second via hole.

Step S105: forming a second insulating layer on the second conductive pattern using the second mask, to form a third via hole and a fourth via hole exposing a partial region of the second conductive pattern.

Step S106: forming a third conductive pattern on the second insulating layer using a third mask including a third mask pattern, in which the third conductive pattern at least partially overlaps with the third via hole in the direction perpendicular to the base substrate and is electrically connected to the second conductive pattern through the third via hole, and the third mask pattern is different from the first mask pattern and the second mask pattern.

In the manufacturing method of the light-emitting substrate provided by the embodiment illustrated in FIG. 1, the first conductive pattern and the second conductive pattern are formed by the same first mask, and the first insulating layer and the second insulating layer are formed by the same second mask, so that the electrical connection between the first conductive pattern, the second conductive pattern, and the third conductive pattern in the light-emitting substrate can be achieved, and the number of masks required in the manufacturing process is also reduced, which optimizes the manufacturing process of the light-emitting substrate and reduces the design and processing difficulty of the light-emitting substrate, thereby reducing the manufacturing cost of the light-emitting substrate.

For example, the first conductive pattern and the second conductive pattern described above may be different film patterns constituting the same wiring in the light-emitting substrate, that is, the first conductive pattern and the second conductive pattern are sequentially arranged on the base substrate to form the wiring. By using the same first mask to prepare different film patterns of the same wiring, the layers of the wiring can be separately prepared. Therefore, without basically increasing the resistance of the wiring, it can not only reduce or avoid the possible peeling phenomenon due to the large overall thickness of the wiring, but also reduce the number of masks required in the manufacturing process, so that the stability of the prepared light-emitting substrate may be improved, the manufacturing process may be simplified, and the design and processing difficulty of the light-emitting substrate may be reduced, thereby reducing the manufacturing cost.

For example, the third conductive pattern may be used to form another wiring overlapped with the wiring composed of the first conductive pattern and the second conductive pattern in a plane parallel to the base substrate to form a grid wiring pattern, so as to reduce the voltage drop where a signal is transmitted through the wiring and improve the consistency of the signal transmission effect. By allowing the second mask pattern of the second mask to include both the pattern used for forming the first via hole and the second via hole for electrically connecting the first conductive pattern and the second conductive pattern, and the pattern used for forming the third via hole and the fourth via hole for electrically connecting the second conductive pattern and the third conductive pattern, the number of masks required in the manufacturing process can be reduced, which can also reduce the design and processing difficulty of the light-emitting substrate, optimize the manufacturing process, and further reduce the manufacturing cost of the light-emitting substrate.

It should be noted that the embodiments of the present disclosure do not limit the specific process methods for forming the above-mentioned first insulating layer and the second insulating layer. For example, the first insulating layer and the second insulating layer may be respectively formed by conventional processes, such as coating, exposure and development. Details may refer to the conventional process methods for forming an insulating layer in the art, which will not be repeated here.

It should be noted that the embodiments of the present disclosure do not limit the specific process methods for forming the above-mentioned first conductive pattern, second conductive pattern, and third conductive pattern. For example, the first conductive pattern, the second conductive pattern, and the third conductive pattern may be respectively formed by the process steps such as forming a metal film layer, coating a photoresist layer on the metal film layer, exposing the photoresist layer with a mask, developing the exposed photoresist layer to obtain a photoresist pattern, etching the metal film layer using the photoresist pattern, peeling off the photoresist pattern, and the like. For example, forming a via hole (for example, the first via hole to the fourth via hole described above) in the insulating layer may respectively adopt the process steps such as forming an insulating layer, coating a photoresist layer on the insulating layer, exposing the photoresist layer with a mask, developing the exposed photoresist layer to obtain a photoresist pattern, etching the insulating layer using the photoresist pattern, peeling off the photoresist pattern, and the like.

In the above patterning process, the method of forming the metal film layer or insulating layer, the method of coating photoresist, the etching method (wet etching or dry etching), and the method of peeling off the photoresist pattern may adopt the conventional process methods in the art, which will not be repeated here. For example, the metal film layer may be formed by a process method such as sputtering, electroplating or electroforming, while the insulating layer may be formed by a method such as coating. Moreover, the embodiments of the present disclosure do not limit the material of the used photoresist, the type of exposure light source, the material for preparing the mask, or the like.

In the following, the manufacturing method of the light-emitting substrate provided by the embodiments of the present disclosure is described by taking the manufacturing method provided by the embodiments of the present disclosure for manufacturing the light-emitting substrate 10 illustrated in FIG. 2 as an example. It should be noted that the embodiments of the present disclosure include but are not limited to this.

Figure 2:
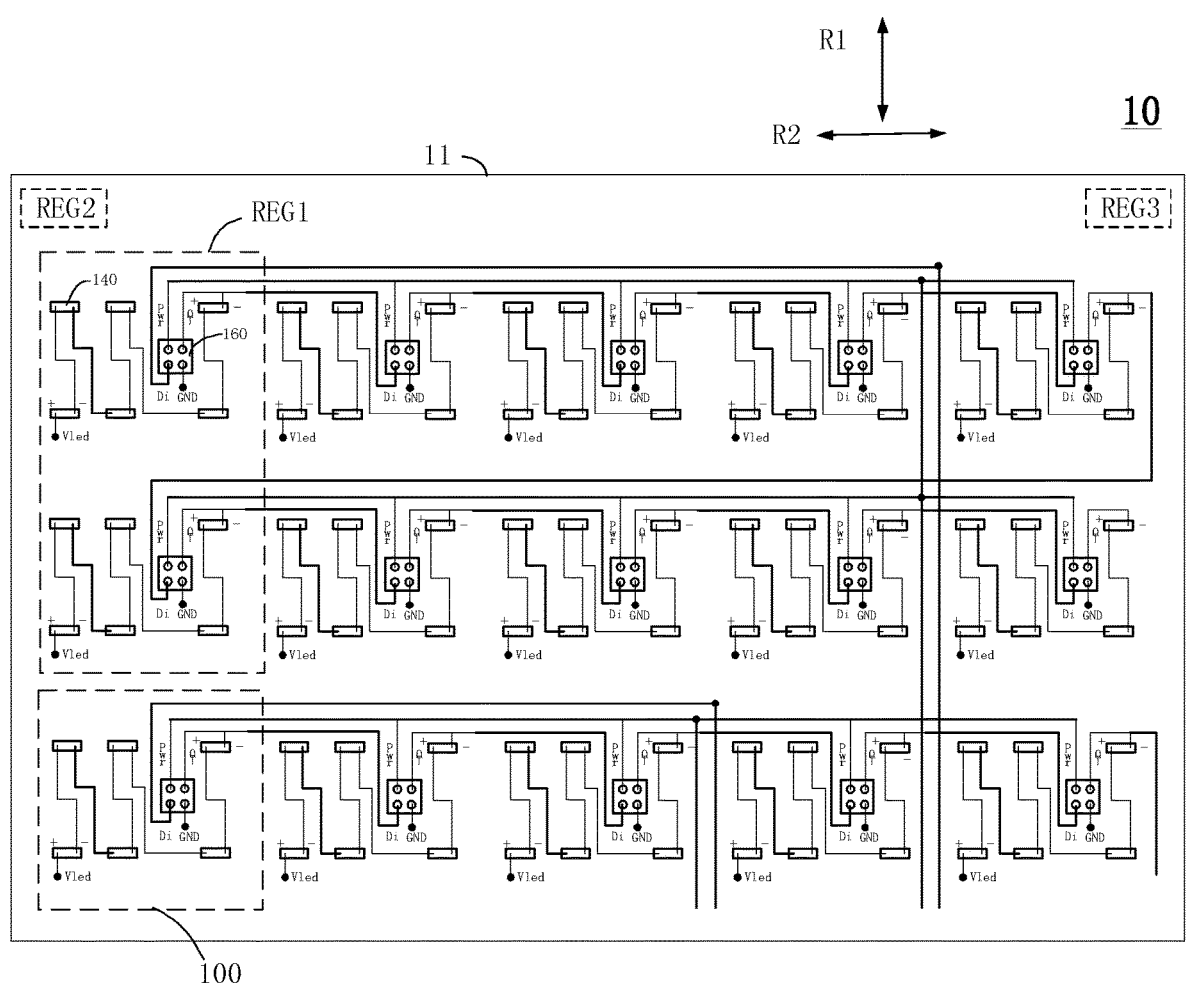
FIG. 2 is a schematic diagram of a light-emitting substrate provided by some embodiments of the present disclosure.
Figure 3:
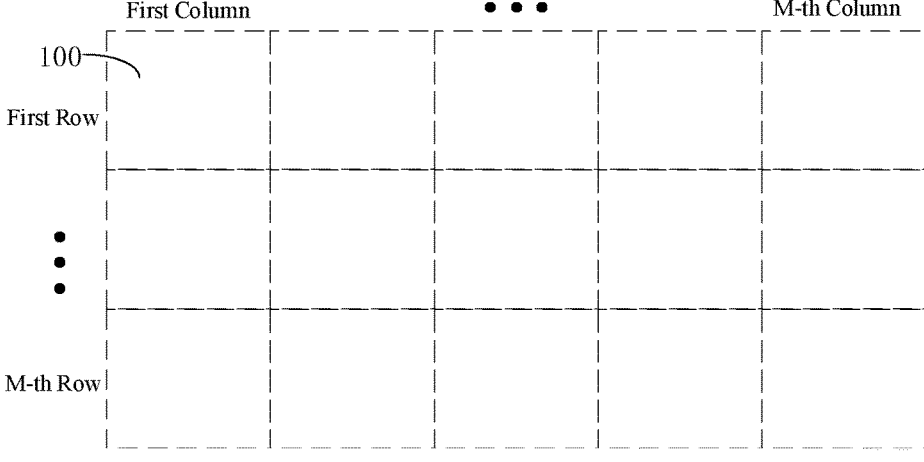
FIG. 3 is a schematic diagram of an arrangement of light-emitting units of the light-emitting substrate illustrated in FIG. 2.

FIG. 2 is a schematic diagram of a light-emitting substrate provided by some embodiments of the present disclosure, and FIG. 3 is a schematic diagram of an arrangement of light-emitting units of the light-emitting substrate illustrated in FIG. 2. As illustrated in FIG. 2 and FIG. 3, the light-emitting substrate 10 includes a base substrate 11 and a plurality of light-emitting units 100 arranged in an array on the base substrate 11. For example, the plurality of light-emitting units 100 are arranged in N rows and M columns, N is an integer greater than 0, and M is an integer greater than 0. For example, the number of light-emitting units 100 may be determined according to the actual needs, for example, according to the size and required brightness of the light-emitting substrate 10. Although only three rows and five columns of light-emitting units 100 are illustrated in FIG. 2, it should be understood that the number of light-emitting units 100 is not limited to this.

For example, the base substrate 11 may be a plastic substrate, a silicon substrate, a ceramic substrate, a glass substrate, a quartz substrate, etc., the base substrate 11 includes a single-layer or multi-layer circuit, and the embodiments of the present disclosure are not limited in this aspect.

For example, each column of the light-emitting units 100 is arranged along the first direction R1, and each row of the light-emitting units 100 is arranged along the second direction R2. For example, the first direction R1 is the column direction, and the second direction R2 is the row direction. Of course, the embodiments of the present disclosure are not limited to this. The first direction R1 and the second direction R2 may be any directions, as long as the first direction R1 and the second direction R2 intersects with each other. Moreover, the plurality of light-emitting units 100 are not limited to being arranged along a straight line, but may also be arranged along a curve, along a ring, or in any way, which may be determined according to the actual needs, and the embodiments of the present disclosure are not limited in this aspect.

Figure 4:
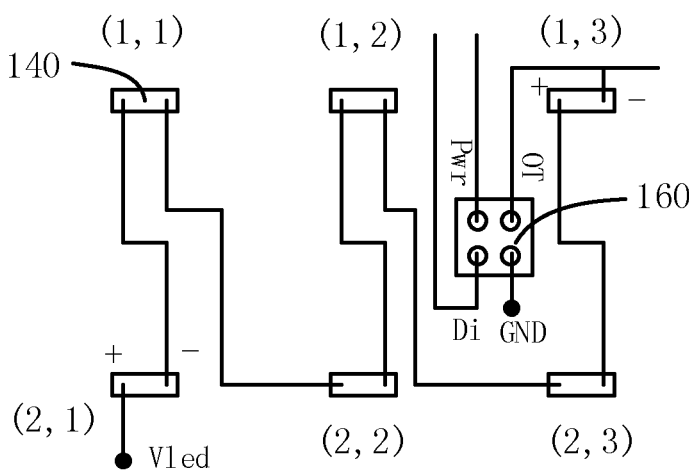
FIG. 4 is a schematic diagram of a light-emitting unit in the light-emitting substrate illustrated in FIG. 2.
Figure 5:
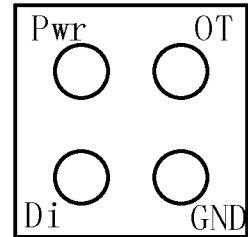
FIG. 5 is a schematic diagram of pins of a driving circuit in the light-emitting unit of the light-emitting substrate illustrated in FIG. 2.

FIG. 4 is a schematic diagram of a light-emitting unit in the light-emitting substrate illustrated in FIG. 2, and FIG. 5 is a schematic diagram of pins of a driving circuit in the light-emitting unit of the light-emitting substrate illustrated in FIG. 2. As illustrated in FIG. 2, FIG. 4, and FIG. 5, each light-emitting unit 100 includes a driving circuit 160, a plurality of light-emitting elements 140, and a driving voltage terminal Vled.

The driving circuit 160 includes a first input terminal Di, a second input terminal Pwr, an output terminal OT, and a common voltage terminal GND. The first input terminal Di receives a first input signal, such as an address signal, for gating the driving circuit 160 of a corresponding address. For example, addresses of different driving circuits 160 may be the same or different. The first input signal may be an 8-bit address signal, and the address to be transmitted can be obtained by parsing the address signal. The second input terminal Pwr receives a second input signal, and the second input signal is, for example, a power line carrier communication signal. For example, the second input signal not only provides power to the driving circuit 160, but also transmits communication data to the driving circuit 160, and the communication data can be used to control the light-emitting duration of the corresponding light-emitting unit 100, thereby controlling the visual light-emitting brightness. The output terminal OT can output different signals in different time periods, for example, output a relay signal and a driving signal, respectively. For example, the relay signal is an address signal provided to other driving circuits 160, that is, the first input terminal Di of another driving circuit 160 receives the relay signal as the first input signal, so as to obtain the address signal. For example, the driving signal may be a driving current for driving the light-emitting element 140 to emit light. The common voltage terminal GND receives a common voltage signal, such as a grounded signal.

The driving circuit 160 is configured to output the relay signal through the output terminal OT within the first time period according to the first input signal received by the first input terminal Di and the second input signal received by the second input terminal Pwr, and to output a driving signal to a plurality of light-emitting elements 140 connected in series in sequence within the second time period through the output terminal OT. In the first time period, the output terminal OT outputs the relay signal, and the relay signal is provided to another driving circuit 160, so that the another driving circuit 160 obtains the address signal. In the second time period, the output terminal OT outputs the driving signal, and the driving signal is provided to the plurality of light-emitting elements 140 connected in series in sequence, so that the light-emitting elements 140 emit light in the second time period. For example, the first time period and the second time period are different time periods. For example, the first time period may be prior to the second time period. The first time period may be continuously connected with the second time period, and the end time of the first time period is the start time of the second time period; alternatively, there may be other time periods between the first time period and the second time period, the other time periods may be used to implement other required functions, and the other time periods may also be only used to separate the first time period and the second time period to avoid the signals of the output terminal OT in the first time period and the second time period from interfering with each other. The specific working principle of the driving circuit 160 may refer to conventional design solutions in the art, and details are not repeated here.

It should be noted that in the case that the driving signal is a driving current, the driving current may flow from the output terminal OT to the light-emitting element 140, or flow from the light-emitting element 140 to the output terminal OT, and the flowing direction of the driving current may be determined according to the actual needs. The embodiments of the present disclosure are not limited in this aspect. In the present disclosure, "the output terminal OT outputs a driving signal" means that the output terminal OT provides a driving signal, and the direction of the driving signal may either flow out from the output terminal OT or flow into the output terminal OT.

For example, as illustrated in FIG. 2 and FIG. 4, the plurality of light-emitting elements 140 are connected in series in sequence, and are connected in series between the driving voltage terminal Vled and the output terminal OT. For example, the light-emitting element 140 may be a micro light-emitting diode (Micro-LED) or a mini light-emitting diode (Mini-LED). For example, each light-emitting element 140 includes a positive electrode (+) and a negative electrode (−) (or may also be referred to as an anode and a cathode), and positive electrodes and negative electrodes of the plurality of light-emitting elements 140 are connected in series in sequence, so that a current path is formed between the driving voltage terminal Vled and the output terminal OT. The driving voltage terminal Vled provides a driving signal to the light-emitting element 140, for example, a high voltage in a time period (the second time period) that needs to allow the light-emitting element 140 to emit light, and a low voltage in other time periods. Therefore, in the second time period, the driving signal (for example, the driving current) flows from the driving voltage terminal Vled through the plurality of light-emitting elements 140 in sequence, and then flows into the output terminal OT of the driving circuit 160. The plurality of light-emitting elements 140 emit light where the driving current flows. By controlling the duration of the driving current, the light-emitting duration of the light-emitting element 140 can be controlled, thereby controlling the visual light-emitting brightness.

For example, as illustrated in FIG. 2 and FIG. 4, in some examples, one light-emitting unit 100 includes six light-emitting elements 140, and the six light-emitting elements 140 are arranged in two rows and three columns. For example, the six light-emitting elements 140 are sequentially numbered as (1, 1), (1, 2), (1, 3), (2, 1), (2, 2) and (2, 3) from left to right and from top to bottom, and the numbering is illustrated in FIG. 4. For example, where the six light-emitting elements 140 are connected in series, the light-emitting element 140 at the position (2, 1) is used as the start point of the series, and the light-emitting elements 140 at the positions (1, 1), (2, 2), (1, 2), (2, 3) and (1, 3) are sequentially connected, and the light-emitting element 140 at the position (1, 3) serves as the end point of the series. For example, the positive electrode of the light-emitting element 140 at the position (2, 1) is connected to the driving voltage terminal VLED, and the negative electrode of the light-emitting element 140 at the position (1, 3) is connected to the output terminal OT of the driving circuit 160. This distribution and series connection can effectively avoid the overlapping of wirings and facilitate the design and preparation. In addition, the bending shape and the length of the wiring between any two adjacent light-emitting elements 140 on the series line may approximately be the same, so that the resistance of the line itself is relatively balanced, which can improve the load balance and improve the stability of the circuit.

Figure 6:
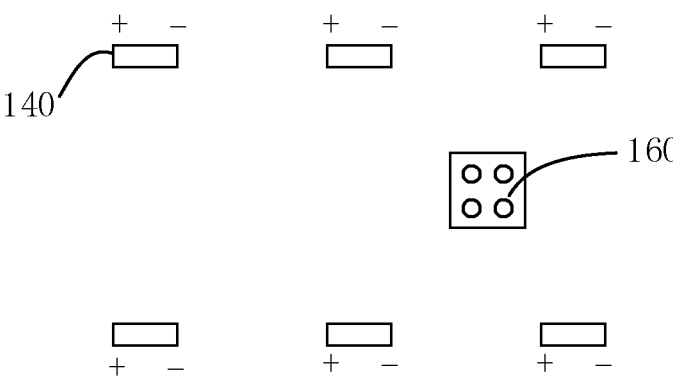
FIG. 6 is a schematic diagram of an arrangement of a light-emitting element and a driving circuit in the light-emitting unit of the light-emitting substrate illustrated in FIG. 2.

FIG. 6 is a schematic diagram of an arrangement of a light-emitting element and a driving circuit in the light-emitting unit of the light-emitting substrate illustrated in FIG. 2. As illustrated in FIG. 6, in the same light-emitting unit 100, the plurality of (for example, six) light-emitting elements 140 are arranged in an array, for example, arranged in multiple rows and multiple columns, which enables the light emission to be more uniform. The driving circuit 160 is located in the gap of the array formed by the plurality of light-emitting elements 140.

It should be noted that, in the embodiments of the present disclosure, the number of light-emitting elements 140 in each light-emitting unit 100 is not limited, and may be any number such as 4, 5, 7, and 8, but not limited to 6. The plurality of light-emitting elements 140 may be arranged in any manner, for example, arranged in a desired pattern, and is not limited to an array arrangement. The arrangement position of the driving circuit 160 is not limited, and may be arranged in any gap between the light-emitting elements 140, which may be determined according to the actual needs, and is not limited by the embodiments of the present disclosure.

The following embodiments of the present disclosure take the wiring layout in the partial region REG1 of the light-emitting substrate 10 illustrated in FIG. 2 as an example to describe the wiring layout in the light-emitting substrate.

Figure 7:
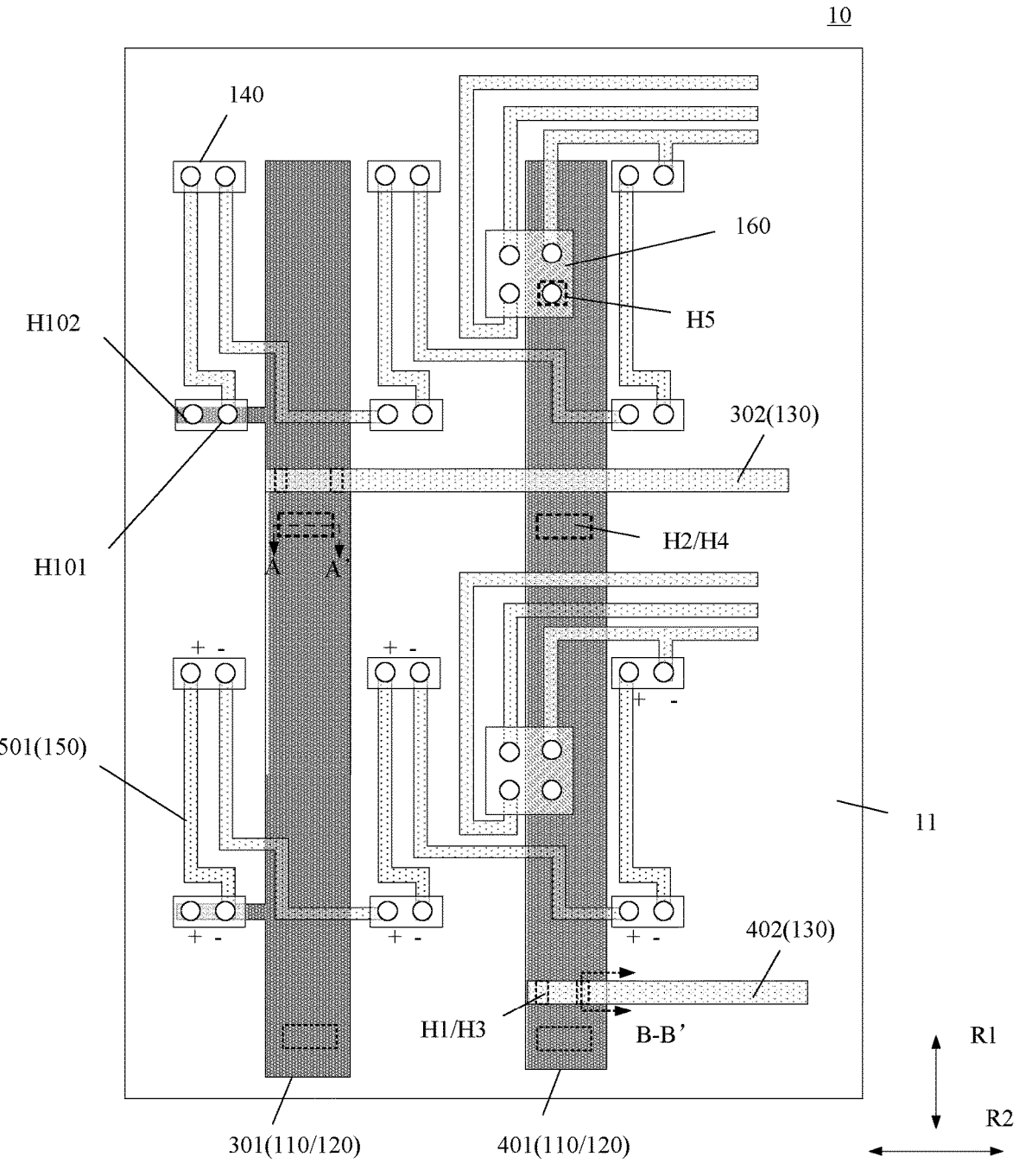
FIG. 7 is a schematic planar diagram of a partial structure of a light-emitting substrate provided by some embodiments of the present disclosure.

FIG. 7 is a schematic planar diagram of a partial structure of a light-emitting substrate provided by some embodiments of the present disclosure. For example, FIG. 7 corresponds to the structure in the partial region REG1 of the light-emitting substrate 10 illustrated in FIG. 2.

For example, as illustrated in FIG. 2, FIG. 4 and FIG. 7, in some embodiments, the light-emitting substrate 10 further includes a plurality of first driving voltage lines 301 and a plurality of first common voltage lines 401 extending in the first direction R1, and further includes a plurality of second driving voltage lines 302 and a plurality of second common voltage lines 402 extending in the second direction R2.

For example, the first driving voltage line 301 is electrically connected to the driving voltage terminal Vled of each light-emitting unit 100, for example, to the positive electrode of the light-emitting element 140 at the position (2, 1), and is configured to transmit the driving voltage to each light-emitting unit 100. The second driving voltage line 302 and the first driving voltage line 301 are electrically connected and form a grid-shaped wiring, so as to reduce the transmission resistance as a whole, thereby improving the voltage consistency at each position in the light-emitting substrate 10.

For example, the first common voltage line 401 is electrically connected to the common voltage terminal GND of the driving circuit 160 of each light-emitting unit 100, and is configured to transmit a common voltage (for example, a grounded voltage) to each light-emitting unit 100. For example, the first common voltage line 401 may be electrically connected to the common voltage terminal GND of the driving circuit 160 through a via hole H5 penetrating the structure or film layer between the first common voltage line 401 and the driving circuit 160 in the direction perpendicular to the base substrate 11 (for example, a direction R3 illustrated in FIG. 8 later) to provide a common voltage. The second common voltage line 402 and the first common voltage line 401 are electrically connected and form a grid-shaped wiring, so as to reduce the transmission resistance as a whole, thereby improving the voltage consistency at each position in the light-emitting substrate 10.

For example, the first driving voltage line 301 and the first common voltage line 401 are located in the same layer, and the second driving voltage line 302 and the second common voltage line 402 are located in the same layer.

It should be noted that the film layer where the first driving voltage line 301 in FIG. 7 is located is below the light-emitting element 140, and therefore the first driving voltage line 301 can extend to the position below the positive electrode of the light-emitting element 140 at the position (2, 1), and is electrically connected to the positive electrode of the light-emitting element 140 at the position (2, 1) through a via hole, that is, the first driving voltage line 301 transmits the driving voltage to the positive electrode (that is, to the driving voltage terminal Vled) of the light-emitting element 140 at the position (2, 1). Although the negative electrode of the light-emitting element 140 at the position (2, 1) in FIG. 7 overlaps with the first driving voltage line 301, the two are located in different film layers and are insulated and separated by an intermediate insulating layer, and thus the negative electrode of the light-emitting element 140 is not electrically connected to the first driving voltage line 301. For example, the film layer where the first common voltage line 401 is located is below the driving circuit 160, and therefore, the first common voltage line 401 is located below the driving circuit 160 and is electrically connected to the common voltage terminal GND of the driving circuit 160 through a via hole.

It should be noted that, in the embodiments of the present disclosure, lengths and widths of the first driving voltage line 301, the second driving voltage line 302, the first common voltage line 401, and the second common voltage line 402 may be set to any applicable values, the lengths may be the same or different, and the widths may also be the same or different, which may be determined according to the actual needs, and are not limited by the embodiments of the present disclosure.

In the following, the case that the first conductive pattern and the second conductive pattern are used to form the first driving voltage line 301 and the first common voltage line 401, and the third conductive pattern is used to form the second driving voltage line 302 and the second common voltage line 402 is taken as an example to describe the manufacturing method provided by the embodiments of the present disclosure.

Figure 8:
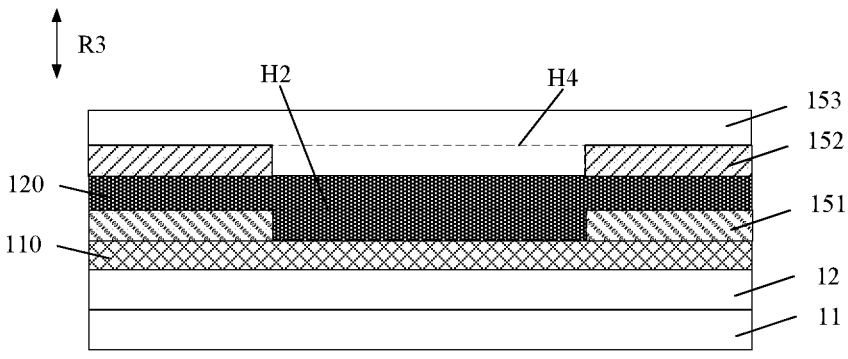
FIG. 8 is a schematic diagram of a partial cross-sectional structure of the light-emitting substrate along a line A-A' illustrated in FIG. 7.
Figure 9:
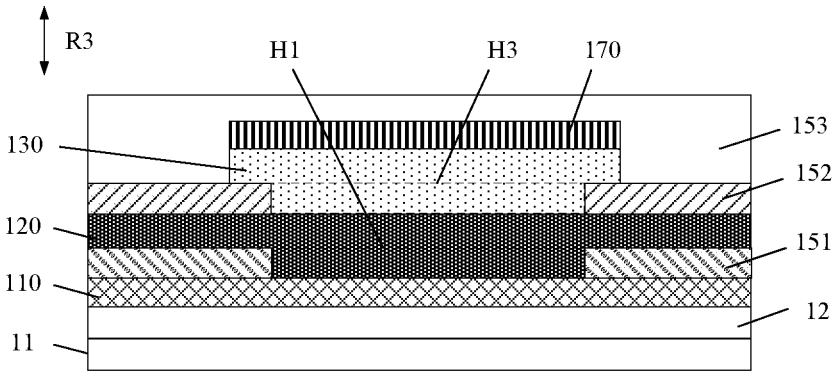
FIG. 9 is a schematic diagram of a partial cross-sectional structure of the light-emitting substrate along a line B-B' illustrated in FIG. 7.

FIG. 8 is a schematic diagram of a partial cross-sectional structure of the light-emitting substrate 10 along a line AA' illustrated in FIG. 7, and FIG. 9 is a schematic diagram of a partial cross-sectional structure of the light-emitting substrate 10 along a line BB' illustrated in FIG. 7.

For example, as illustrated in FIG. 7, FIG. 8 and FIG. 9, the manufacturing method of the light-emitting substrate 10 illustrated in FIG. 2 may include the following steps.

Step S201: providing the base substrate 11.

Step S202: forming the first conductive pattern 110 on the base substrate 11 using the first mask including the first mask pattern.

For example, in Step S202, a whole conductive material layer may be formed on the base substrate 11 through, for example, a sputtering process or an electroplating process, and then the conductive material layer may be patterned through such as a photolithography process using the first mask to form the first conductive pattern 110; alternatively, in Step S202, the first mask may also be directly attached to the base substrate 11, so as to form the first conductive pattern 110 directly on the base substrate 11 through, for example, a sputtering process or an electroplating process. The embodiments of the present disclosure do not limit the specific process method in Step S202, and details may refer to conventional process designs in the art, which are not described herein. The following other steps in the manufacturing method provided by the embodiments of the present disclosure are basically the same as or similar to this, and details are not described herein.

Step S203: forming the first insulating layer 151 on the first conductive pattern 110 using the second mask including the second mask pattern to form the first via hole H1 and the second via hole H2 exposing the partial region of the first conductive pattern 110, the second mask pattern being different from the first mask pattern.

Step S204: forming the second conductive pattern 120 on the first insulating layer 151 using the first mask. The second conductive pattern 120 at least partially overlaps with the first via hole H1 and the second via hole H2 in the direction R3 perpendicular to the base substrate 11 and is electrically connected to the first conductive pattern 110 through the first via hole H1 and the second via hole H2, respectively.

For example, the first conductive pattern 110 and the second conductive pattern 120 constitute a power supply wiring pattern including the first driving voltage line 301 and the first common voltage line 401, so that the same first mask can be used to realize the preparation of the double-film layer structures of the first driving voltage line 301 and the first common voltage line 401, thereby increasing the thicknesses of the first driving voltage line 301 and the first common voltage line 401 to meet the resistance requirements. For example, the thickness of the first driving voltage line 301 and the thickness of the first common voltage line 401 in the direction perpendicular to the base substrate 11 may range from 1.2 μm to 2.4 μm, further for example, from 1.8 μm to 2 μm.

Step S205: forming the second insulating layer 152 on the second conductive pattern 120 using the second mask to form the third via hole H3 and the fourth via hole H4 exposing the partial region of the second conductive pattern 120.

Step S206: forming the third conductive pattern 130 on the second insulating layer 152 using the third mask including the third mask pattern. The third conductive pattern 130 at least partially overlaps with the third via hole H3 in the direction R3 perpendicular to the base substrate 11 and is electrically connected to the second conductive pattern 120 through the third via hole H3, and the third mask pattern is different from the first mask pattern and the second mask pattern.

For example, the third conductive pattern 130 constitutes a power supply wiring pattern including the second driving voltage line 302 and the second common voltage line 402. For example, the thickness of the second driving voltage line 302 and the thickness of the second common voltage line 402 in the direction perpendicular to the base substrate 11 may range from 0.3 μm to 0.9 μm, further for example, from 0.6 μm to 0.8 μm.

Therefore, in the process of preparing the first driving voltage line 301, the second driving voltage line 302, the first common voltage line 401, and the second common voltage line 402 of the light-emitting substrate 10, by allowing the second mask pattern of the second mask to include not only a pattern used for forming the first via hole H1 and the second via hole H2 for electrically connecting the first conductive pattern 110 with the second conductive pattern 120, but also a pattern used for forming the third via hole H3 and the fourth via hole H4 for electrically connecting the second conductive pattern 120 with the third conductive pattern 130, the same first mask can be used to achieve the preparation of multiple conductive film layer patterns in the first driving voltage line 301 and the first common voltage line 401 with multi-film layer structures, and the same second mask can be used to achieve the electrical connection between the first driving voltage line 301 and the second driving voltage line 302, and the electrical connection between the first common voltage line 401 and the second common voltage line 402, so that the above-mentioned embodiments of the present disclosure reduce the number of masks required in the manufacturing process and reduce the design and processing difficulty of the light-emitting substrate 10, thereby reducing the manufacturing cost of the light-emitting substrate 10.

For example, the material of the first conductive pattern 110 may include molybdenum metal and its alloy, copper metal and its alloy, etc., or may also include other suitable metal conductive materials. For example, the first conductive pattern 110 may include a metal stack structure formed of copper metal and molybdenum metal, such as a three-layer stacked structure of molybdenum-copper-molybdenum (Mo—Cu—Mo).

For example, the thickness of the first conductive pattern 110 in the direction perpendicular to the base substrate 11 may range from 0.6 μm to 1.2 μm, further for example, from 0.9 μm to 1 μm.

For example, the material of the second conductive pattern 120 may include molybdenum metal and its alloy, copper metal and its alloy, etc., or may also include other suitable metal conductive materials. For example, the second conductive pattern 120 may include a metal stack structure formed of copper metal and molybdenum metal, such as a three-layer stacked structure of molybdenum-copper-molybdenum (Mo—Cu—Mo).

For example, the thickness of the second conductive pattern 120 in the direction perpendicular to the base substrate 11 may range from 0.6 μm to 1.2 μm, further for example, from 0.9 μm to 1 μm.

For example, the material of the third conductive pattern 130 may include molybdenum metal and its alloy, copper metal and its alloy, etc., or may also include other suitable metal conductive materials. For example, the third conductive pattern 130 may include a metal stack structure formed of copper metal and molybdenum metal, such as a double-layer stacked structure of molybdenum-copper (Mo—Cu).

For example, the thickness of the third conductive pattern 130 in the direction perpendicular to the base substrate 11 may range from 0.3 μm to 0.9 μm, further for example, from 0.6 μm to 0.8 μm.

For example, the material of one or more of the first insulating layer 151 and the second insulating layer 152 may include insulating materials such as silicon oxide, silicon nitride, and silicon oxy-nitride. Materials of the first insulating layer 151 and the second insulating layer 152 may be the same or different from each other, which is not limited by the embodiments of the present disclosure.

For example, as illustrated in FIG. 7, FIG. 8 and FIG. 9, the orthographic projection of the first via hole H1 on the base substrate 11 at least partially overlaps with, such as completely overlaps with, the orthographic projection of the third via hole H3 on the base substrate 11. The orthographic projection of the second via hole H2 on the base substrate 11 at least partially overlaps with, for example, completely overlaps with the orthographic projection of the fourth via hole H4 on the base substrate 11. Therefore, the positioning between the first conductive layer 110, the second conductive layer 120, and the third conductive layer 130 can be achieved, and the electrical connection effect between the third conductive layer 130 and the first conductive layer 110 and between the third conductive layer 130 and the second conductive layer 120 can be improved, so that the stability of the light-emitting substrate 10 is improved.

In some embodiments of the present disclosure, the first mask pattern of the first mask includes a first preparation pattern used for forming a conductive pattern (for example, the first conductive pattern 110 and the second conductive pattern 120) and a first positioning pattern used for positioning. The second mask pattern of the second mask includes a second preparation pattern used for forming an insulating pattern (for example, the insulating pattern of the first insulating layer 151 including the first via hole H1 and the second via hole H2, and the insulating pattern of the second insulating layer 152 including the third via hole H3 and the fourth via hole H4) and a second positioning pattern used for positioning. For example, taking the light-emitting substrate 10 as an example, the first preparation pattern can be used to form the first conductive pattern 110 and the second conductive pattern 120, that is, to form the first driving voltage line 301 and the first common voltage line 401; and the second preparation pattern can be used to form the first insulating layer 151 including the first via hole H1 and the second via hole H2, and to form the second insulating layer 152 including the third via hole H3 and the fourth via hole H4, so as to achieve the electrical connection between the first conductive pattern 110 and the second conductive pattern 120, and the electrical connection between the third conductive pattern 130 and the second conductive pattern 120.

For example, the manufacturing method of the light-emitting substrate 10 further includes: forming the first positioning structure using the first positioning pattern of the first mask while forming the first conductive pattern 110 on the base substrate 11 using the first mask; in the process of forming the first insulating layer 151 on the first conductive pattern 110 using the second mask, using the first positioning structure to cooperate with the second positioning pattern of the second mask to position the second mask, and forming the second positioning structure using the second positioning pattern of the second mask while forming the first via hole H1 and the second via hole H2; in the process of forming the second conductive pattern 120 on the first insulating layer 151 using the first mask, using the second positioning structure to cooperate with the first positioning pattern of the first mask to position the first mask, and forming the third positioning structure using the first positioning pattern of the first mask while forming the second conductive pattern 120; and in the process of forming the second insulating layer 152 on the second conductive pattern 120 using the second mask, using the third positioning structure to cooperate with the second positioning pattern of the second mask to position the second mask.

Therefore, the first positioning structure, the second positioning structure, and the third positioning structure can respectively realize the positioning of the first mask and the second mask in the above-mentioned steps S201 to S206, thereby improving the accuracy and precision of the prepared conductive patterns or insulating patterns on the base substrate 11, and further improving the yield and stability of the prepared light-emitting substrate 10.

For example, the first positioning structure, the second positioning structure, and the third positioning structure may be formed in a region of the base substrate 11 without being provided with devices or structures such as the light-emitting element 140, the driving circuit 160, the first driving voltage line 301, the second driving voltage line 302, the first common voltage line 401, and the second common voltage line 402, and for example, may be formed in a peripheral region of the light-emitting substrate 10, to avoid adverse effects on the preparation of devices or structures in the light-emitting substrate 10. In addition, the embodiments of the present disclosure do not limit the number of the prepared first positioning structure, second positioning structure and third positioning structure. For example, in the case that the light-emitting substrate 10 is in a square shape, the four corners of the square may be respectively formed with one or more first positioning structures, one or more second positioning structures, and one or more third positioning structures, thereby better achieving positioning.

For example, taking the light-emitting substrate 10 illustrated in FIG. 2 as an example, as illustrated in FIG. 2, the first positioning structure, the second positioning structure, and the third positioning structure may be formed in the corner regions REG2 and REG3 of the polygonal-shaped (for example, rectangular-shaped) light-emitting substrate 10, or may also be formed in other suitable regions that will not adversely affect the preparation of devices or structures in the light-emitting substrate 10. The embodiments of the present disclosure do not limit the specific positions where the first positioning structure, the second positioning structure, and the third positioning structure are formed.

Figure 10A:
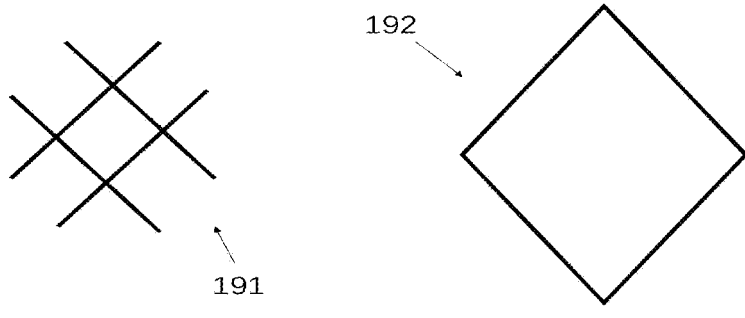
FIG. 10A is a schematic diagram of an example of a first positioning pattern of a first mask provided by some embodiments of the present disclosure.
Figure 10B:
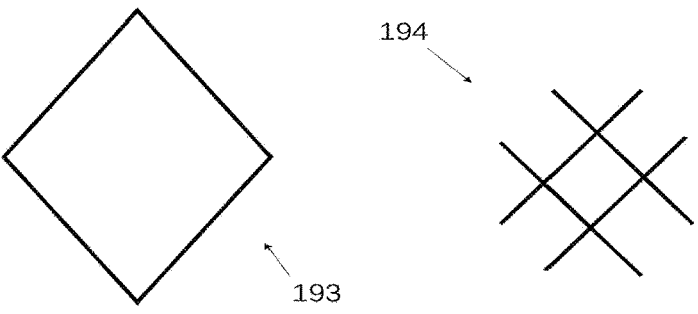
FIG. 10B is a schematic diagram of an example of a second positioning pattern of a second mask provided by some embodiments of the present disclosure.
Figure 10C:
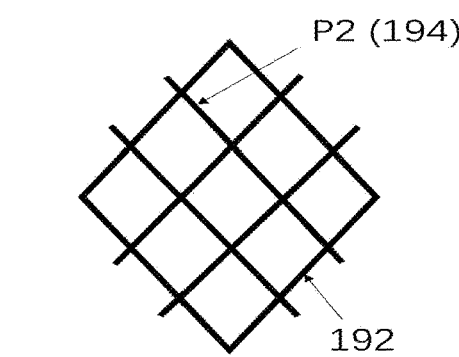
FIG. 10C is a schematic diagram of an example in which positioning structures are nested with each other for positioning in some embodiments of the present disclosure.
Figure 10D:
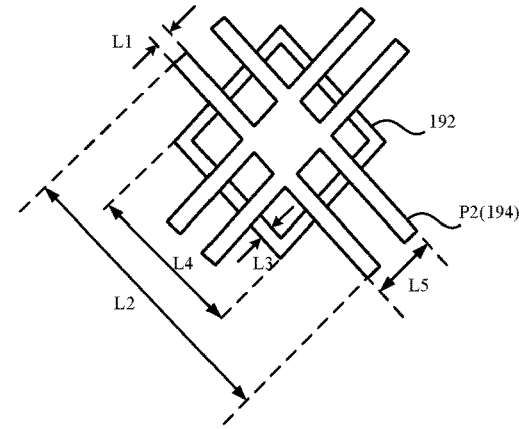
FIG. 10D is a schematic diagram of a specific example of FIG. 10C.

FIG. 10A is a schematic diagram of an example of a first positioning pattern of a first mask provided by some embodiments of the present disclosure, FIG. 10B is a schematic diagram of an example of a second positioning pattern of a second mask provided by some embodiments of the present disclosure, FIG. 10C is a schematic diagram of an example in which positioning structures are nested with each other for positioning in some embodiments of the present disclosure, and FIG. 10D is a schematic diagram of a specific example of FIG. 10C.

For example, as illustrated in FIG. 10A and FIG. 10B, the first positioning pattern includes a first sub-pattern 191 and a second sub-pattern 192, and the second positioning pattern includes a third sub-pattern 193 and a fourth sub-pattern 194. The first sub-pattern 191 of the first positioning pattern is used to form the first positioning structure and the third positioning structure, and the fourth sub-pattern 194 of the second positioning pattern is used to form the second positioning structure. The second sub-pattern 192 of the first positioning pattern corresponds to the fourth sub-pattern 194 of the second positioning pattern for positioning the first mask. For example, as illustrated in FIG. 10C, the second positioning structure P2 formed by the fourth sub-pattern 194 can be nested in the second sub-pattern 192 to achieve positioning. Similarly, the third sub-pattern 193 of the second positioning pattern corresponds to the first sub-pattern 191 of the first positioning pattern for positioning the second mask. For example, the first positioning structure and the third positioning structure formed by the first sub-pattern 191 can be nested in the third sub-pattern 193 to achieve positioning.

For example, taking the example illustrated in FIG. 10A and FIG. 10B as an example, the first sub-pattern 191 and the fourth sub-pattern 194 may be "#"-shaped patterns, and the second sub-pattern 192 and the third sub-pattern 193 may be diamond-shaped patterns matched with the "#"-shaped patterns. For example, sizes of the first sub-pattern 191 and the fourth sub-pattern 194 may be the same. Taking the fourth sub-pattern 194 as an example, as illustrated in FIG. 10D, the length L2 of a segment that constitutes the "#"-shaped pattern may range from 1000 microns to 1400 microns, further for example, from 1100 microns to 1200 microns, the width L1 may range from 30 microns to 60 microns, further for example, from 40 microns to 50 microns, and the width L5 may range from 150 microns to 250 microns, further for example, from 180 microns to 200 microns. The sizes of the second sub-pattern 192 and the third sub-pattern 193 may be the same. Taking the second sub-pattern 192 as an example, as illustrated in FIG. 10D, the length L4 of one side of the diamond-shaped pattern may range from 400 microns to 700 microns, further for example, from 500 microns to 600 microns, and the width L3 may range from 30 microns to 60 microns, further for example, from 40 microns to 50 microns.

It should be noted that, the first positioning pattern and the second positioning pattern illustrated in FIG. 10A and FIG. 10B described above are only exemplary descriptions, and the embodiments of the present disclosure do not limit the specific structures of the first sub-pattern and the second sub-pattern included in the first positioning pattern and the third sub-pattern and the fourth sub-pattern included in the second positioning pattern, as long as the first sub-pattern and the third sub-pattern can cooperate with each other to achieve positioning, and the second sub-pattern and the fourth sub-pattern can cooperate with each other to achieve positioning.

It should be noted that the embodiments of the present disclosure do not limit the specific sizes of the formed first positioning structure, the second positioning structure, and the third positioning structure, as long as the positioning of the first mask and the second mask on the base substrate 11 can be achieved without adversely affecting the preparation of devices or structures in the light-emitting substrate 10.

For example, in some examples of the present disclosure, Step S202 of the above-mentioned manufacturing method of the light-emitting substrate 10 specifically includes: forming the first conductive pattern 110 on the base substrate 11 through the first preparation pattern of the first mask. Step S204 of the manufacturing method of the light-emitting substrate 10 specifically includes: forming the second conductive pattern 120 on the first insulating layer 151 through the first preparation pattern of the first mask. The first conductive pattern 110 and the second conductive pattern 120 include the same conductive pattern portions, and the same conductive pattern portions at least partially overlap with each other, for example, completely overlap with each other, in the direction R3 perpendicular to the base substrate 11. Thus, the first conductive pattern 110 and the second conductive pattern 120 can jointly form the first driving voltage line 301 or the first common voltage line 401 having a multi-film layer structure.

For example, in some examples of the present disclosure, Step S203 of the above-mentioned manufacturing method of the light-emitting substrate 10 specifically includes: forming the first insulating layer 151 on the first conductive pattern 110 through the second preparation pattern of the second mask. Step S205 of the above-mentioned manufacturing method of the light-emitting substrate 10 specifically includes: forming the second insulating layer 152 on the second conductive pattern 120 through the second preparation pattern of the second mask. The first insulating layer 151 and the second insulating layer 152 include the same via hole pattern portions, and the same via hole pattern portions at least partially overlap with each other, for example, completely overlap with each other, in the direction R3 perpendicular to the base substrate 11. Therefore, on the basis of achieving the electrical connection between the first conductive pattern 110 and the second conductive pattern 120 and the electrical connection between the third conductive pattern 130 and the second conductive pattern 120, the electrical connection effect between the third conductive pattern 130 and the first conductive pattern 110 and the electrical connection effect between the third conductive pattern 130 and the second conductive pattern 120 can also be improved, thereby improving the stability of the electrical connection between the first driving voltage line 301 and the second driving voltage line 302, and the stability of the electrical connection between the first common voltage line 401 and the second common voltage line 402.

For example, as illustrated in FIG. 7, FIG. 8 and FIG. 9, in some embodiments of the present disclosure, the manufacturing method of the light-emitting substrate 10 further includes: forming a fourth conductive pattern 170 on the third conductive pattern 130 using a third mask, an orthographic projection of the fourth conductive pattern on the base substrate 11 at least partially overlapping with, for example, completely overlapping with, an orthographic projection of the third conductive pattern 130 on the base substrate 11. Thus, after the third conductive pattern 130 used for constituting the second driving voltage line 302 and the second common voltage line 402 is formed, the fourth conductive pattern 170 forms a protection layer to cover and protect surfaces of the second driving voltage line 302 and the second common voltage line 402 away from the base substrate 11, which can reduce the interference of other devices or structures in the light-emitting substrate 10 to the signals on the second driving voltage line 302 and the second common voltage line 402, thereby improving the stability of signal transmission, and at the same time, because the third conductive pattern 130 and the fourth conductive pattern 170 can be prepared using the same third mask, the number of masks required in the manufacturing process can also be reduced, thereby further simplifying the design and processing difficulty of the light-emitting substrate 10, and reducing the manufacturing cost of the light-emitting substrate 10.

For example, the material of the third conductive pattern 130 includes a first metal material, the material of the fourth conductive pattern 170 includes a second metal material, and the first metal material and the second metal material are different. Therefore, the fourth conductive pattern 170 using the second metal material different from the first metal material can further improve the protection effect of the fourth conductive pattern 170 on the third conductive pattern 130, thereby further improving the stability of the light-emitting substrate 10.

For example, the first metal material may include molybdenum metal and its alloys, copper metal and its alloys, etc., or may also include other suitable metal conductive materials. For example, the third conductive pattern 130 may include a double-layer metal structure formed of copper metal and molybdenum metal. For example, the second metal material may include molybdenum metal and its alloys, copper metal and its alloys, nickel metal and its alloys, etc., or may also include other suitable metal conductive materials. For example, the fourth conductive pattern 170 may include a single-layer metal structure formed of such as copper nickel (CuNi).

In some embodiments of the present disclosure, as illustrated in FIG. 4, FIG. 7, FIG. 8 and FIG. 9, the manufacturing method of the light-emitting substrate 10 further includes: forming a fifth conductive pattern 150 different from the third conductive pattern 130 on the second insulating layer 152 using the third mask while forming the third conductive pattern 130 on the second insulating layer 152 using the third mask. The fifth conductive pattern 150 is insulated from the first conductive pattern 110 and the second conductive pattern 120, and the light-emitting element 140 is electrically connected to the output terminal OT of the driving circuit 160 through the fifth conductive pattern 150.

For example, the above-mentioned fifth conductive pattern 150 may be used to form a plurality of connection wirings 501 for electrically connecting the plurality of light-emitting elements 140 with the output terminal OT of the driving circuit 160. For example, the plurality of connection wirings 501 may include a connection wiring connecting the negative electrode of the light-emitting element 140 at the position (1, 3) in the light-emitting unit 100 to the output terminal OT of the driving circuit 160, and a connection wiring connecting the negative electrode of one light-emitting element 140 to the positive electrode of another light-emitting element 140 in the light-emitting unit 100. Therefore, the plurality of light-emitting elements 140 in the light-emitting unit 100 are connected in series with each other and are electrically connected between the driving voltage terminal Vled and the output terminal OT.

In some embodiments of the present disclosure, while forming the third conductive pattern 130 and the fifth conductive pattern 150 on the second insulating layer 152 using the third mask, the third mask may also be used to form other conductive patterns, different from the third conductive pattern 130 and the fifth conductive pattern 150, on the second insulating layer 152, so as to form other connection wirings in the same layer as, for example, the second driving voltage line 302, the second common voltage line 402, and the connection wiring 501 in the light-emitting substrate, for example as illustrated in FIG. 4 and FIG. 7, the connection wiring for connecting the first input terminal Di of the driving circuit 160, the connection wiring for connecting the second input terminal Pwr of the driving circuit 160, etc. The embodiments of the present disclosure are not limited in this aspect.

In some embodiments of the present disclosure, the manufacturing method of the light-emitting substrate 10 further includes: forming a third insulating layer 153, at least partially covering (for example, completely covering) the third conductive pattern 130 and the fifth conductive pattern 150, on the third conductive pattern 130 and the fifth conductive pattern 150 using a fourth mask.

The third insulating layer 153 includes a first connection via hole H101 for electrically connecting the fifth conductive pattern 150 with the light-emitting element 140. For example, the first connection via hole H101 can be used to electrically connect the negative electrode of the light-emitting element 140 at the position (2, 1) with the connection wiring 501, so as to be electrically connected to the positive electrode of the light-emitting element 140 at the position (1, 1) through the connection wiring 501. The second insulating layer 152 and/or the third insulating layer 153 includes a second connection via hole H102 for electrically connecting the light-emitting element 140 with the second conductive pattern 120. For example, the second connection via hole H102 can be used to electrically connect the positive electrode of the light-emitting element 140 at the position (2, 1) with the first driving voltage line 301 to receive the driving voltage, so that the plurality of light-emitting elements 140 in the light-emitting unit 100 are connected in series with each other between the driving voltage terminal Vled and the output terminal OT.

For example, the material of the third insulating layer 153 may include insulating materials such as silicon oxide, silicon nitride, and silicon oxy-nitride. The materials of the first insulating layer 151, the second insulating layer 152 and the third insulating layer 153 may be the same or different from each other, which is not limited by the embodiments of the present disclosure.

In some embodiments of the present disclosure, the manufacturing method of the light-emitting substrate 10 further includes: providing the light-emitting element 140 on the third insulating layer 153, and the light-emitting element 140 is electrically connected to the fifth conductive pattern 150 through the first connection via hole H101 and is electrically connected to the second conductive pattern 120 through the second connection via hole H102. For example, the negative electrode of the light-emitting element 140 at the position (2, 1) is electrically connected to the connection wiring 501 through the first connection via hole H101, and the positive electrode of the light-emitting element 140 at the position (2, 1) is electrically connected to the first driving voltage line 301 through the second connection via hole H102.

In some embodiments of the present disclosure, as illustrated in FIG. 7, FIG. 8 and FIG. 9, before forming the first conductive pattern 110 on the base substrate 11 using the first mask, the manufacturing method of the light-emitting substrate 10 further includes forming a buffer layer 12 on the base substrate 11, and the first conductive pattern 110 is formed on the buffer layer 12.

For example, the buffer layer 12 can not only alleviate or prevent harmful substances in the base substrate 11 from intruding into the interior of the light-emitting substrate 10, but also increase the adhesion of the films in the light-emitting substrate 10 on the base substrate 11. For example, the material of the buffer layer 12 may include insulating materials such as silicon oxide, silicon nitride, and silicon oxy-nitride, and the embodiments of the present disclosure are not limited in this aspect.

In some embodiments of the present disclosure, after the above-mentioned steps are completed, the manufacturing method of the light-emitting substrate 10 may further include other conventional processes or steps, such as cutting, die bonding, gluing, bonding, etc. Details may refer to the conventional design and processing schemes in the art, which will not be repeated here.

At least one embodiment of the present disclosure further provides a light-emitting substrate, and the light-emitting substrate includes a base substrate and further includes a first conductive pattern, a first insulating layer, a second conductive pattern, a second insulating layer, and a third conductive pattern which are sequentially arranged on the base substrate in a direction away from the base substrate. The first conductive pattern and the second conductive pattern include same conductive pattern portions, and the first insulating layer and the second insulating layer include same via hole pattern portions; a via hole pattern of the first insulating layer includes a first via hole and a second via hole, and the second conductive pattern is electrically connected to the first conductive pattern through the first via hole and the second via hole; and a via hole pattern of the second insulating layer includes a third via hole and a fourth via hole, and the third conductive pattern is electrically connected to the second conductive pattern through the third via hole. An orthographic projection of the first via hole on the base substrate at least partially overlaps with an orthographic projection of the third via hole on the base substrate, and an orthographic projection of the second via hole on the base substrate at least partially overlaps with an orthographic projection of the fourth via hole on the base substrate.

In the light-emitting substrate provided by the at least one embodiment of the present disclosure described above, because the first conductive pattern and the second conductive pattern include the same conductive pattern portions, and the first insulating layer and the second insulating layer include the same via hole pattern portions, in the manufacturing process, the first conductive pattern and the second conductive pattern can be formed by the same mask, and the first insulating layer and the second insulating layer can be formed by the same mask, so that the number of masks required in the manufacturing process can be reduced and the manufacturing process of the light-emitting substrate can be optimized, so as to reduce the manufacturing cost of the light-emitting substrate, reduce the design and processing difficulty of the light-emitting substrate, and facilitate mass production and application.

The light-emitting substrate provided by the at least one embodiment of the present disclosure described above may be the light-emitting substrate 10 provided in the above-mentioned embodiments of the manufacturing method of the light-emitting substrate. The detailed description and technical effects of the light-emitting substrate provided by the embodiments of the present disclosure may refer to the specific description of the light-emitting substrate 10 described above, which will not be repeated here.

In some embodiments of the present disclosure, taking the light-emitting substrate 10 as an example, the first conductive pattern 110 includes a plurality of first conductive blocks extending in the first direction R1, and the second conductive pattern 120 includes a plurality of second conductive blocks extending in the first direction R1. For example, the plurality of first conductive blocks and the plurality of second conductive blocks can be used to form a plurality of first driving voltage lines 301 and a plurality of first common voltage lines 401 extending in the first direction R1. The third conductive pattern 130 includes a plurality of third conductive blocks extending in the second direction R2 different from the first direction R1. For example, the plurality of third conductive blocks can be used to form a plurality of second driving voltage lines 302 and a plurality of second common voltage lines 402 extending in the second direction R2. At least one of the plurality of second conductive blocks and at least one of the plurality of third conductive blocks at least partially overlap with each other in the direction R3 perpendicular to the base substrate 11, and are electrically connected with each other through the third via hole H3. For example, the plurality of first driving voltage lines 301 and the plurality of second driving voltage lines 302 overlap with each other in the direction R3 perpendicular to the base substrate 11 to form a grid-shaped structure, and the plurality of first common voltage lines 401 and the plurality of second common voltage lines 402 overlap with each other in the direction R3 perpendicular to the base substrate 11 to form a grid-shaped structure, so as to reduce the transmission resistance as a whole and improve the voltage consistency at each position in the light-emitting substrate 10.

In some embodiments of the present disclosure, taking the light-emitting substrate 10 as an example, an orthographic projection of at least one of the plurality of first conductive blocks on the base substrate 11 at least partially overlaps with, for example, completely overlaps with, an orthographic projection of at least one of the plurality of second conductive blocks on the base substrate 11, and the at least one of the plurality of first conductive blocks is electrically connected to the at least one of the plurality of second conductive blocks through the first via hole H1 and the second via hole H2, so that a plurality of first driving voltage lines 301 and a plurality of first common voltage lines 401 with double-film layer structures are formed.

In some embodiments of the present disclosure, taking the light-emitting substrate 10 as an example, at least one of the plurality of first conductive blocks and at least one of the plurality of second conductive blocks have the same width in the second direction R2, so as to improve the overall structure of the first driving voltage line 301 and the overall structure of the first common voltage line 401 formed by the first conductive block and the second conductive block, thereby optimizing the wiring layout design in the light-emitting substrate 10.

In some embodiments of the present disclosure, taking the light-emitting substrate 10 as an example, the light-emitting substrate 10 further includes a fifth conductive pattern 150 and a light-emitting element 140. The fifth conductive pattern 150 is arranged in the same layer as the third conductive pattern 130, and the light-emitting element 140 is located on a side of the third conductive pattern 130 and the fifth conductive pattern 150 away from the base substrate 11. The fifth conductive pattern 150 is insulated from the first conductive pattern 110 and the second conductive pattern 120, the light-emitting element 140 is electrically connected to the output terminal OT of the driving circuit 160 through the fifth conductive pattern 150, the fifth conductive pattern 150 includes at least one fifth conductive block extending in the first direction R1, a first terminal of the light-emitting element 140 (for example, the positive or negative electrode of the light-emitting element) is electrically connected to one fifth conductive block, and a second terminal of the light-emitting element 140 (for example, the negative or positive electrode of the light-emitting element) is electrically connected to one second conductive block or another fifth conductive block.

For example, the fifth conductive pattern 150 may include a plurality of fifth conductive blocks for forming a plurality of connection wirings 501. The plurality of connection wirings 501 may include a connection wiring connecting the negative electrode of the light-emitting element 140 at the position (1, 3) in the light-emitting unit 100 with the output terminal OT of the driving circuit 160, and a connection wiring connecting the negative electrode or positive electrode of one light-emitting element 140 with the positive electrode or negative electrode of another light-emitting element 140 in the light-emitting unit 100. Thus, the plurality of light-emitting elements 140 in the light-emitting unit 100 are connected in series with each other and electrically connected between the driving voltage terminal Vled and the output terminal OT.

In some embodiments of the present disclosure, taking the light-emitting substrate 10 as an example, the light-emitting substrate 10 further includes a third insulating layer 153, the third insulating layer 153 is located between the third conductive pattern 130 and the light-emitting element 140 and between the fifth conductive pattern 150 and the light-emitting element 140, the third insulating layer 153 includes a first connection via hole H101 to electrically connect at least one fifth conductive block with the first terminal and/or the second terminal of the light-emitting element 140 through the first connection via hole H101, and the second insulating layer 152 and the third insulating layer 153 include a second connection via hole H102 to electrically connect at least one second conductive block with the second terminal of the light-emitting element 140 through the second connection via hole H102.

For example, the first connection via hole H101 can be used to electrically connect the negative electrode of the light-emitting element 140 at the position (2, 1) with one connection wiring 501, so as to be electrically connected with the positive electrode of the light-emitting element 140 at the position (1, 1) through the connection wiring 501. The second connection via hole H102 can be used to electrically connect the positive electrode of the light-emitting element 140 at the position (2, 1) with the first driving voltage line 301 to receive the driving voltage. Thus, the plurality of light-emitting elements 140 in the light-emitting unit 100 are connected in series between the driving voltage terminal Vled and the output terminal OT.

The light-emitting substrate provided by the embodiments of the present disclosure may also include more components, structures, etc., which may be determined according to the actual needs, and the embodiments of the present disclosure are not limited in this aspect.

At least one embodiment of the present disclosure further provides a display device, and the display device includes a display panel and the light-emitting substrate provided by any one of the embodiments of the present disclosure.

For example, the display device provided by the embodiments of the present disclosure may be a liquid crystal display device. Alternatively, the display device provided by the embodiments of the present disclosure may also be an organic light-emitting diode display device, a quantum dot light-emitting diode display device, an electronic paper display device, and other devices with display functions or other types of display devices, which are not limited by the embodiments of the present disclosure. The display device can achieve the regional independent control of luminous brightness, and has advantages of the low power consumption, high integration, simple control mode, etc., which can cooperate with, for example, a liquid crystal display device to achieve high contrast display.

It should be noted that the above-mentioned light-emitting substrate provided by the embodiments of the present disclosure can be applied to the above-mentioned display device as a backlight unit, or can be used alone as a substrate with the display function or light-emitting function, and the embodiments of the present disclosure are not limited in this aspect.

FIG. 11 is a schematic cross-sectional view of a display device provided by some embodiments of the present disclosure. For example, as illustrated in FIG. 11, in some embodiments, the display device 70 includes a display panel 710 and a light-emitting substrate 720. For example, the light-emitting substrate 720 may be a light-emitting substrate provided by any one of the embodiments of the present disclosure, such as the above-mentioned light-emitting substrate 10.

For example, the display panel 710 has a display side P1 and a non-display side P2 opposite to the display side P1, and the light-emitting substrate 720 is arranged on the non-display side P2 of the display panel 710 as a backlight unit. For example, the light-emitting substrate 720 can provide the backlight to the display panel 710 as a surface light source. For example, the display panel 710 may be an LCD panel, an electronic paper display panel, etc., and the embodiments of the present disclosure are not limited in this aspect.

For example, the display device 70 may be any product or component with display functions, such as a mobile phone, a tablet computer, a television, a display, a notebook computer, a digital photo frame, a navigator, an e-book, etc., and the embodiments of the present disclosure are not limited in this aspect.

The detailed description and technical effects of the display device provided by the embodiments of the present disclosure may refer to the above-mentioned description of the light-emitting substrate and the manufacturing method of the light-emitting substrate, which will not be repeated here. The display device may also include more components and structures, which may be determined according to the actual needs, and the embodiments of the present disclosure are not limited in this aspect.

For the present disclosure, the following statements should be noted.

(1) The accompanying drawings related to the embodiment(s) of the present disclosure involve only the structure(s) in connection with the embodiment(s) of the present disclosure, and other structure(s) can be referred to common design(s).

(2) For the purpose of clarity, in accompanying drawings for illustrating the embodiment(s) of the present disclosure, the thickness of a layer or a region may be enlarged or narrowed, that is, the drawings are not drawn in a real scale. It should be understood that, in the case that a component such as a layer, a film, a region, a substrate, or the like is referred to be "on" or "under" another component, the component may be "directly" "on" or "under" the another component, or an intermediate component may be disposed therebetween.

(3) In case of no conflict, the embodiments of the present disclosure and features in one embodiment or in different embodiments can be combined to obtain new embodiments.

What have been described above merely are specific implementations of the present disclosure, and the protection scope of the present disclosure is not limited thereto. Any modifications or substitutions that easily occur to those skilled in the art within the technical scope of the present disclosure should be within the protection scope of the present disclosure. Therefore, the protection scope of the present disclosure should be based on the protection scope of the claims.

What is claimed is:

1. A manufacturing method of a light-emitting substrate, comprising:

providing a base substrate;

forming a first conductive pattern on the base substrate using a first mask comprising a first mask pattern;

forming a first insulating layer on the first conductive pattern using a second mask comprising a second mask pattern, to form a first via hole and a second via hole exposing a partial region of the first conductive pattern, wherein the second mask pattern is different from the first mask pattern;

forming a second conductive pattern on the first insulating layer using the first mask, wherein the second conductive pattern at least partially overlaps with the first via hole and the second via hole in a direction perpendicular to the base substrate, and is electrically connected to the first conductive pattern through the first via hole and the second via hole;

forming a second insulating layer on the second conductive pattern using the second mask, to form a third via hole and a fourth via hole exposing a partial region of the second conductive pattern; and forming a third conductive pattern on the second insulating layer using a third mask comprising a third mask pattern, wherein the third conductive pattern at least partially overlaps with the third via hole in the direction perpendicular to the base substrate and is electrically connected to the second conductive pattern through the third via hole, and the third mask pattern is different from the first mask pattern and the second mask pattern;

wherein an orthographic projection of the first via hole on the base substrate at least partially overlaps with an orthographic projection of the third via hole on the base substrate, and an orthographic projection of the second via hole on the base substrate at least partially overlaps with an orthographic projection of the fourth via hole on the base substrate.

2. The manufacturing method of the light-emitting substrate according to claim 1, wherein the first mask pattern comprises a first preparation pattern for forming a conductive pattern and a first positioning pattern for positioning, and the second mask pattern comprises a second preparation pattern for forming an insulating pattern and a second positioning pattern for positioning; and the manufacturing method further comprises:

forming a first positioning structure using the first positioning pattern of the first mask while forming the first conductive pattern on the base substrate using the first mask;

in a process of forming the first insulating layer on the first conductive pattern using the second mask, using the first positioning structure to cooperate with the second positioning pattern of the second mask to position the second mask, and forming a second positioning structure using the second positioning pattern of the second mask while forming the first via hole and the second via hole;

in a process of forming the second conductive pattern on the first insulating layer using the first mask, using the second positioning structure to cooperate with the first positioning pattern of the first mask to position the first mask, and forming a third positioning structure using the first positioning pattern of the first mask while forming the second conductive patter; and in a process of forming the second insulating layer on the second conductive pattern using the second mask, using the third positioning structure to cooperate with the second positioning pattern of the second mask to position the second mask.

3. The manufacturing method of the light-emitting substrate according to claim 2, wherein the first positioning pattern comprises a first sub-pattern and a second sub-pattern, and the second positioning pattern comprises a third sub-pattern and a fourth sub-pattern;

the first sub-pattern of the first positioning pattern is used to form the first positioning structure and the third positioning structure, and the fourth sub-pattern of the second positioning pattern is used to form the second positioning structure; and the second sub-pattern of the first positioning pattern corresponds to the fourth sub-pattern of the second positioning pattern for positioning the first mask, and the third sub-pattern of the second positioning pattern corresponds to the first sub-pattern of the first positioning pattern for positioning the second mask.

4. The manufacturing method of the light-emitting substrate according to claim 2, wherein forming the first conductive pattern on the base substrate using the first mask comprises:

forming the first conductive pattern on the base substrate through the first preparation pattern of the first mask;

forming the second conductive pattern on the first insulating layer using the first mask comprises:

forming the second conductive pattern on the first insulating layer through the first preparation pattern of the first mask, wherein the first conductive pattern and the second conductive pattern comprise same conductive pattern portions, and the same conductive pattern portions at least partially overlap in the direction perpendicular to the base substrate.

5. The manufacturing method of the light-emitting substrate according to claim 2, wherein forming the first insulating layer on the first conductive pattern using the second mask comprises:

forming the first insulating layer on the first conductive pattern through the second preparation pattern of the second mask; and forming the second insulating layer on the second conductive pattern using the second mask comprises:

forming the second insulating layer on the second conductive pattern through the second preparation pattern of the second mask, wherein the first insulating layer and the second insulating layer comprise same via hole pattern portions, and the same via hole pattern portions at least partially overlap in the direction perpendicular to the base substrate.

6. The manufacturing method of the light-emitting substrate according to claim 1, further comprising:

forming a fourth conductive pattern on the third conductive pattern using the third mask, wherein an orthographic projection of the fourth conductive pattern on the base substrate at least partially overlaps with an orthographic projection of the third conductive pattern on the base substrate.

7. The manufacturing method of the light-emitting substrate according to claim 6, wherein a material of the third conductive pattern comprises a first metal material, a material of the fourth conductive pattern comprises a second metal material, and the first metal material is different from the second metal material.

8. The manufacturing method of the light-emitting substrate according to claim 1, further comprising:

forming a fifth conductive pattern, different from the third conductive pattern, on the second insulating layer using the third mask while forming the third conductive pattern on the second insulating layer using the third mask, wherein the fifth conductive pattern is insulated from the first conductive pattern and the second conductive pattern, and a light-emitting element is electrically connected to an output terminal of a driving circuit through the fifth conductive pattern.

9. The manufacturing method of the light-emitting substrate according to claim 8, further comprising:

forming a third insulating layer, at least partially covering the third conductive pattern and the fifth conductive pattern, on the third conductive pattern and the fifth conductive pattern using a fourth mask, wherein the third insulating layer comprises a first connection via hole for electrically connecting the fifth conductive pattern to the light-emitting element, and the second insulating layer and/or the third insulating layer comprises a second connection via hole for electrically connecting the light-emitting element to the second conductive pattern.

10. The manufacturing method of the light-emitting substrate according to claim 9, further comprising:

providing the light-emitting element on the third insulating layer, wherein the light-emitting element is electrically connected to the fifth conductive pattern through the first connection via hole and is electrically connected to the second conductive pattern through the second connection via hole.

11. The manufacturing method of the light-emitting substrate according to claim 1, wherein before forming the first conductive pattern on the base substrate using the first mask, the manufacturing method further comprises:

forming a buffer layer on the base substrate, wherein the first conductive pattern is formed on the buffer layer.

12. A light-emitting substrate, comprising a base substrate and further comprising a first conductive pattern, a first insulating layer, a second conductive pattern, a second insulating layer, and a third conductive pattern which are sequentially arranged on the base substrate in a direction away from the base substrate, wherein the first conductive pattern and the second conductive pattern comprise same conductive pattern portions, and the first insulating layer and the second insulating layer comprise same via hole pattern portions;

a via hole pattern of the first insulating layer comprises a first via hole and a second via hole, and the second conductive pattern is electrically connected to the first conductive pattern through the first via hole and the second via hole;

a via hole pattern of the second insulating layer comprises a third via hole and a fourth via hole, and the third conductive pattern is electrically connected to the second conductive pattern through the third via hole; and an orthographic projection of the first via hole on the base substrate at least partially overlaps with an orthographic projection of the third via hole on the base substrate, and an orthographic projection of the second via hole on the base substrate at least partially overlaps with an orthographic projection of the fourth via hole on the base substrate.

13. The light-emitting substrate according to claim 12, wherein the first conductive pattern comprises a plurality of first conductive blocks extending in a first direction, the second conductive pattern comprises a plurality of second conductive blocks extending in the first direction, and the third conductive pattern comprises a plurality of third conductive blocks extending in a second direction different from the first direction; and in a direction perpendicular to the base substrate, at least one of the plurality of second conductive blocks and at least one of the plurality of third conductive blocks at least partially overlap and are electrically connected with each other through the third via hole.

14. The light-emitting substrate according to claim 13, wherein an orthographic projection of at least one of the plurality of first conductive blocks on the base substrate at least partially overlaps with an orthographic projection of at least one of the plurality of second conductive blocks on the base substrate, and the at least one of the plurality of first conductive blocks is electrically connected to the at least one of the plurality of second conductive blocks through the first via hole and the second via hole.

15. The light-emitting substrate according to claim 14, wherein the at least one of the plurality of first conductive blocks and the at least one of the plurality of second conductive blocks have same widths in the second direction.

16. The light-emitting substrate according to claim 13, further comprising:

a fifth conductive pattern, in a same layer as the third conductive pattern, and a light-emitting element, on a side of the third conductive pattern and the fifth conductive pattern away from the base substrate, wherein the fifth conductive pattern is insulated from the first conductive pattern and the second conductive pattern, the light-emitting element is electrically connected to an output terminal of a driving circuit through the fifth conductive pattern, the fifth conductive pattern comprises at least one fifth conductive block extending in the first direction, a first terminal of the light-emitting element is electrically connected to one fifth conductive block, and a second terminal of the light-emitting element is electrically connected to one second conductive block or another fifth conductive block.

17. The light-emitting substrate according to claim 16, further comprising a third insulating layer, wherein the third insulating layer is between the third conductive pattern and the light-emitting element and between the fifth conductive pattern and the light-emitting element, the third insulating layer comprises a first connection via hole to allow the at least one fifth conductive block to be electrically connected to the first terminal and/or the second terminal of the light-emitting element through the first connection via hole, and the second insulating layer and the third insulating layer comprise a second connection via hole to allow the one second conductive block to be electrically connected to the second terminal of the light-emitting element through the second connection via hole.

18. A display device, comprising a light-emitting substrate, wherein the light-emitting substrate comprises a base substrate and further comprises a first conductive pattern, a first insulating layer, a second conductive pattern, a second insulating layer, and a third conductive pattern which are sequentially arranged on the base substrate in a direction away from the base substrate;

the first conductive pattern and the second conductive pattern comprise same conductive pattern portions, and the first insulating layer and the second insulating layer comprise same via hole pattern portions;

a via hole pattern of the first insulating layer comprises a first via hole and a second via hole, and the second conductive pattern is electrically connected to the first conductive pattern through the first via hole and the second via hole;

a via hole pattern of the second insulating layer comprises a third via hole and a fourth via hole, and the third conductive pattern is electrically connected to the second conductive pattern through the third via hole; and an orthographic projection of the first via hole on the base substrate at least partially overlaps with an orthographic projection of the third via hole on the base substrate, and an orthographic projection of the second via hole on the base substrate at least partially overlaps with an orthographic projection of the fourth via hole on the base substrate.

19. The display device according to claim 18, further comprising a display panel, wherein the display panel has a display side and a non-display side opposite to the display side, and the light-emitting substrate is on the non-display side of the display panel to serve as a backlight unit.

* * * * *